United States Patent
Ozawa

(10) Patent No.: US 10,461,106 B2
(45) Date of Patent: Oct. 29, 2019

(54) IMAGING ELEMENT AND CAMERA SYSTEM

(71) Applicant: SONY CORPORATION, Tokyo (JP)

(72) Inventor: Ken Ozawa, Kanagawa (JP)

(73) Assignee: Sony Corporation, Tokyo (JP)

(*) Notice: Subject to any disclaimer, the term of this patent is extended or adjusted under 35 U.S.C. 154(b) by 0 days.

(21) Appl. No.: 16/064,563

(22) PCT Filed: Oct. 19, 2016

(86) PCT No.: PCT/JP2016/080950
§ 371 (c)(1),
(2) Date: Jun. 21, 2018

(87) PCT Pub. No.: WO2017/134864
PCT Pub. Date: Aug. 10, 2017

(65) Prior Publication Data
US 2019/0006406 A1 Jan. 3, 2019

(30) Foreign Application Priority Data
Feb. 2, 2016 (JP) .................. 2016-017900

(51) Int. Cl.
| | | |
|---|---|---|
| *H01L 27/146* | (2006.01) | |
| *G02B 5/20* | (2006.01) | |
| *G02B 5/22* | (2006.01) | |
| *H01L 27/14* | (2006.01) | |
| *H04N 9/07* | (2006.01) | |
| *H01L 27/30* | (2006.01) | |

(52) U.S. Cl.
CPC ......... *H01L 27/14621* (2013.01); *G02B 5/20* (2013.01); *G02B 5/22* (2013.01);
(Continued)

(58) Field of Classification Search
CPC .............. H01L 27/14621; H01L 27/14; H01L 27/1462; H01L 27/14623; H01L 27/14645;
(Continued)

(56) References Cited

U.S. PATENT DOCUMENTS

2005/0040378 A1* 2/2005 Kobayashi ............. G02B 5/208
252/587
2012/0012965 A1 1/2012 Maeda
(Continued)

FOREIGN PATENT DOCUMENTS

JP H10-210486 8/1998
JP 2003-348604 12/2003
(Continued)

OTHER PUBLICATIONS

International Search Report prepared by the Japan Patent Office dated Oct. 19, 2016, for International Application No. PCT/JP2016/080950.

*Primary Examiner* — Sitaramarao S Yechuri
(74) *Attorney, Agent, or Firm* — Sheridan Ross P.C.

(57) ABSTRACT

An imaging element includes a plurality of photoelectric conversion sections. The photoelectric conversion sections are arrayed on a substrate to receive light incident through a dual-pass filter that has transmission bands for visible light and a predetermined range of near-infrared light. The photoelectric conversion sections include a visible light photoelectric conversion section and a near-infrared light photoelectric conversion section. The visible light photoelectric conversion section includes a red light photoelectric conversion section, a green light photoelectric conversion section, and a blue light photoelectric conversion section.

18 Claims, 33 Drawing Sheets

(52) U.S. Cl.
CPC .......... *H01L 27/14* (2013.01); *H01L 27/1462* (2013.01); *H01L 27/14623* (2013.01); *H01L 27/14645* (2013.01); *H01L 27/14649* (2013.01); *H01L 27/307* (2013.01); *H04N 9/07* (2013.01); *H01L 27/1463* (2013.01); *H01L 27/14627* (2013.01)

(58) Field of Classification Search
CPC ............. H01L 27/14649; H01L 27/307; H01L 27/14627; H01L 27/1463; G02B 5/20; G02B 5/22; G02B 5/33; G02B 5/369; H04N 9/07
See application file for complete search history.

(56) References Cited

U.S. PATENT DOCUMENTS

| | | | | |
|---|---|---|---|---|
| 2013/0334402 A1* | 12/2013 | Izuha | ................... | H01L 27/146 250/208.1 |
| 2014/0117485 A1* | 5/2014 | Rhodes | ............. | H01L 27/14643 257/443 |
| 2014/0138519 A1 | 5/2014 | Wang et al. | | |
| 2015/0002707 A1 | 1/2015 | Wu | | |
| 2015/0062347 A1 | 3/2015 | Jin | | |
| 2015/0130007 A1 | 5/2015 | Kawamura | | |
| 2015/0221691 A1* | 8/2015 | Watanabe | .............. | H04N 5/332 348/164 |
| 2015/0287766 A1* | 10/2015 | Kim | ....................... | H01L 27/307 |
| 2017/0187948 A1* | 6/2017 | Wang | .................... | G02B 3/0006 |
| 2017/0317132 A1* | 11/2017 | Hatakeyama | ........... | H01L 27/14 |

FOREIGN PATENT DOCUMENTS

| | | |
|---|---|---|
| JP | 2012-023207 | 2/2012 |
| JP | 2014-103657 | 6/2014 |
| JP | 2015-012619 | 1/2015 |
| JP | 2015-092521 | 5/2015 |
| JP | 2016-146619 | 8/2016 |
| WO | WO 2015/056734 | 4/2015 |
| WO | WO 2015/198782 | 12/2015 |

* cited by examiner

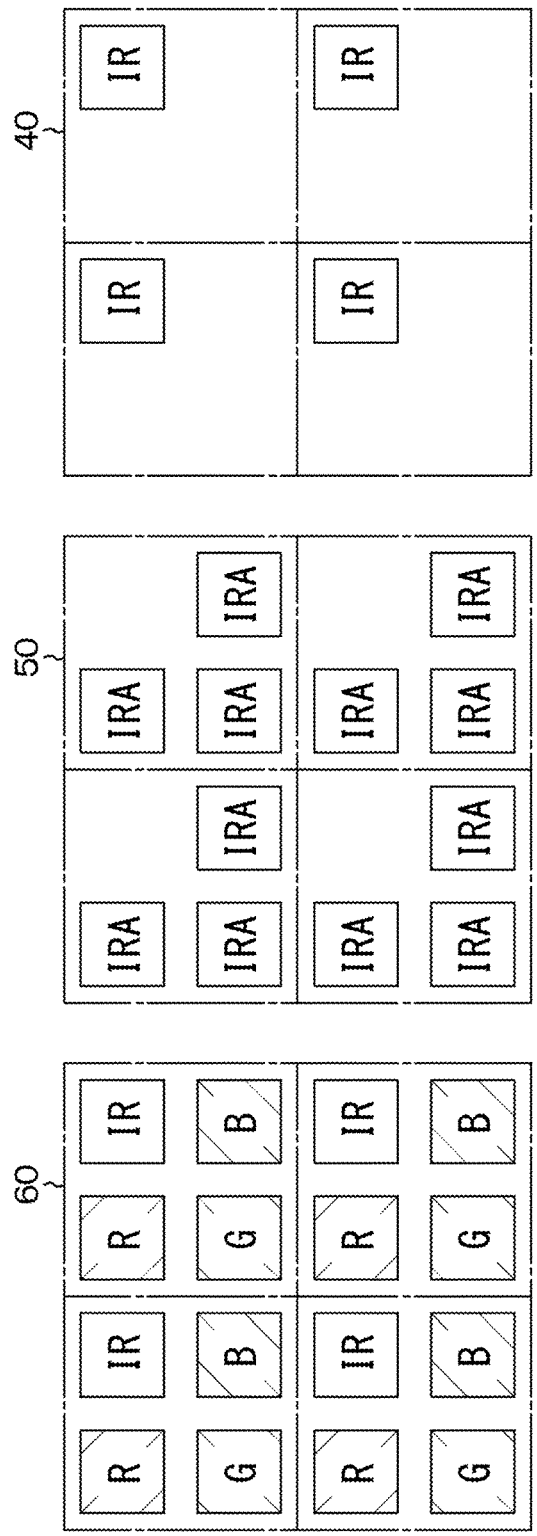

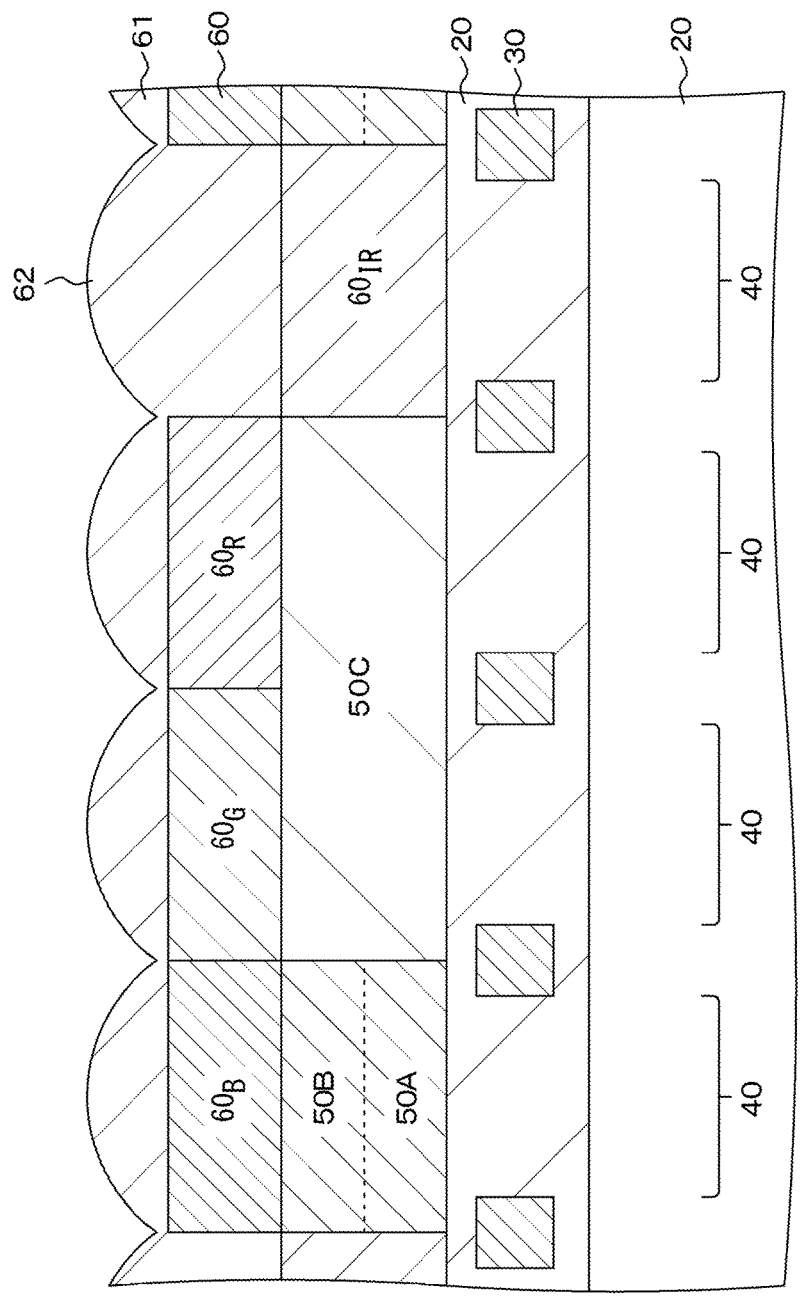

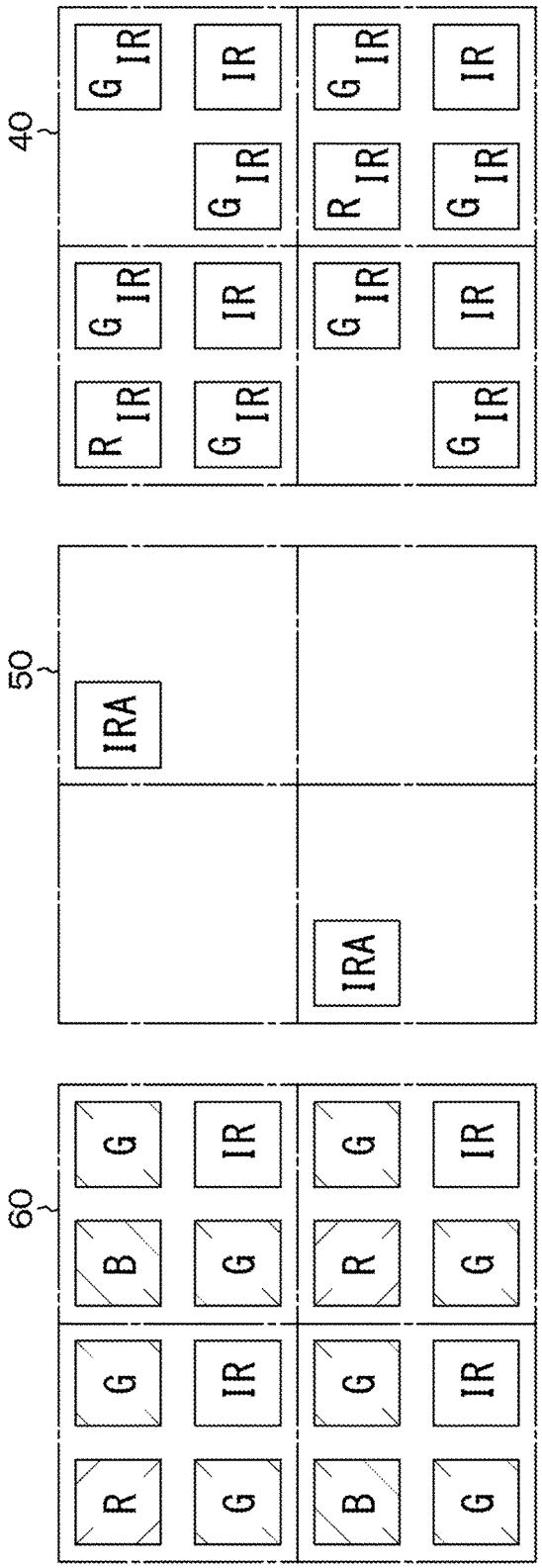

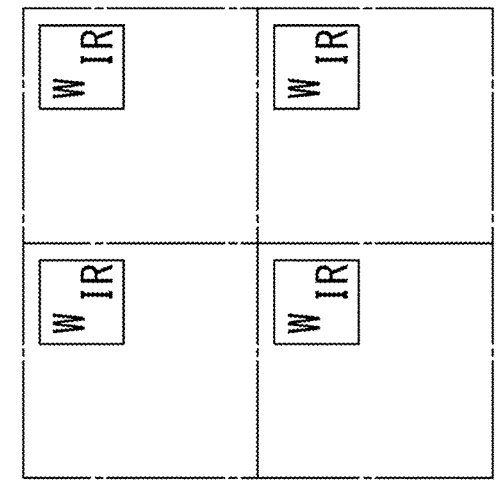
FIG. 30C
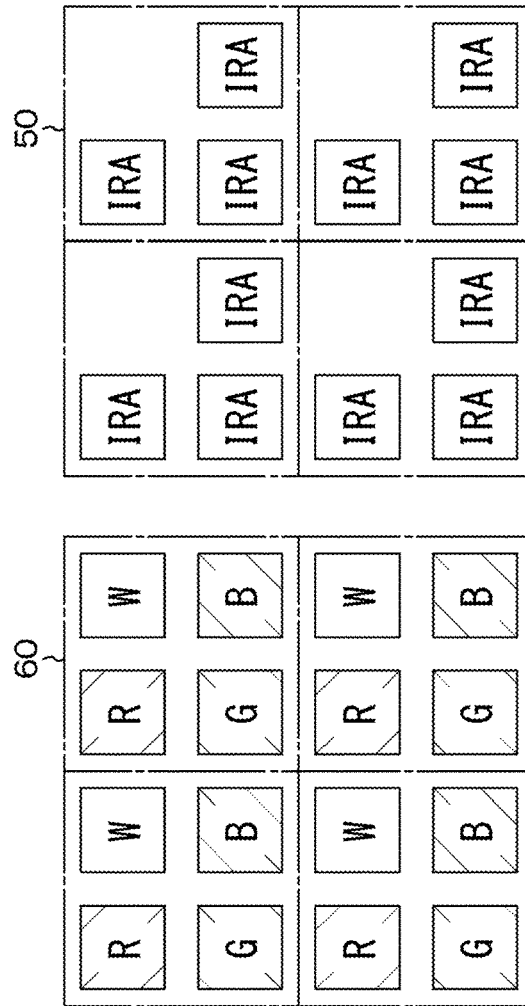
FIG. 30B
FIG. 30A

IMAGING ELEMENT AND CAMERA SYSTEM

CROSS REFERENCE TO RELATED APPLICATIONS

This application is a national stage application under 35 U.S.C. 371 and claims the benefit of PCT Application No. PCT/JP2016/080950 having an international filing date of 19 Oct. 2016, which designated the United States, which PCT application claimed the benefit of Japanese Patent Application No. 2016-017900 filed 02 Feb. 2016, the entire disclosures of each of which are incorporated herein by reference.

TECHNICAL FIELD

The present disclosure relates to an imaging element and a camera system.

BACKGROUND ART

In the past, an image pickup device capable of simultaneously acquiring a color image and a near-infrared image was proposed. Disclosed, for example, in JP 1998-210486 A (PTL 1) is a technology for dividing incoming light into four types of light, namely, near-infrared light, red light, green light, and blue light, by using, for example, a cold mirror or a dichroic mirror and acquiring an image signal of each color by receiving the four types of light with respective independent light-receiving means.

CITATION LIST

Patent Literature

[PTL 1]
JP 1998-210486 A

SUMMARY

Technical Problem

In recent years, it is demanded that camera systems used, for example, with portable electronic devices be thinned. The camera systems cannot be thinned as needed by a configuration for dividing incoming light into four types of light, namely, near-infrared light, red light, green light, and blue light, and receiving the four types of light with respective independent light-receiving means.

In view of the above circumstances, an object of the present invention is to provide an imaging element having a one-lens-one-sensor structure capable of simultaneously acquiring a color image and a near-infrared image. Another object of the present invention is to provide a camera system that uses such an imaging element.

Solution to Problem

In accomplishing the above objects, according to a first aspect of the present disclosure, there is provided an imaging element including a plurality of photoelectric conversion sections. The photoelectric conversion sections are arrayed on a substrate to receive light incident through a dual-pass filter that has transmission bands for visible light and a predetermined range of near-infrared light. The photoelectric conversion sections include a visible light photoelectric conversion section and a near-infrared light photoelectric conversion section. The visible light photoelectric conversion section includes a red light photoelectric conversion section, a green light photoelectric conversion section, and a blue light photoelectric conversion section.

In accomplishing the above objects, according to the first aspect of the present disclosure, there is provided a camera system including an optical section, an imaging element, and a signal processing section. The optical section forms an image of a subject. The imaging element includes a plurality of photoelectric conversion sections that are arrayed on a substrate to receive light incident through a dual-pass filter having transmission bands for visible light and a predetermined range of near-infrared light. The signal processing section processes signals from the photoelectric conversion sections. The photoelectric conversion sections include a visible light photoelectric conversion section and a near-infrared light photoelectric conversion section. The signal processing section performs computation after changing a matrix coefficient in accordance with the position of a photoelectric conversion section. The matrix coefficient is used to perform computation for eliminating the influence of near-infrared light included in a signal from the visible light photoelectric conversion section.

Advantageous Effects of Invention

One imaging element according to the present disclosure makes it possible to simultaneously acquire a color image and a near-infrared image. Further, as described later, it is possible to reduce the difference, for example, in color tone between the central and peripheral parts of an image to be captured. The advantageous effects described in this specification are merely illustrative and not restrictive. The present disclosure can provide additional advantageous effects.

BRIEF DESCRIPTION OF DRAWINGS

FIG. 25 are schematic plan views illustrating the arrangement of the color filters and near-infrared absorption filters in the first embodiment. FIG. 25A is a schematic plan view illustrating the arrangement of the color filters in the first embodiment. FIG. 25B is a schematic plan view illustrating the arrangement of the near-infrared absorption filters in the first embodiment. FIG. 25C is a schematic plan view illustrating the arrangement of photoelectric conversion sections that are involved in the acquisition of a near-infrared image in the first embodiment.

FIG. 26 are schematic plan views illustrating the arrangement of the color filters and near-infrared absorption filters in the fourth embodiment.

FIG. 27 is a schematic partial end view of the imaging element.

FIG. 28 are schematic plan views illustrating the arrangement of the color filters and near-infrared absorption filters in a fifth embodiment.

FIG. 29 are diagrams illustrating the arrangement of the color filters and near-infrared absorption filters in the fifth embodiment in a case where the arrangement of the near-infrared absorption filters is limited. FIG. 29A is a schematic plan view illustrating the arrangement of the color filters. FIG. 29B is a schematic plan view illustrating the arrangement of the near-infrared absorption filters. FIG. 29C is a schematic plan view illustrating the arrangement of the photoelectric conversion sections that are involved in the acquisition of a near-infrared image.

FIG. 30 are schematic plan views illustrating the arrangement of the color filters and near-infrared absorption filters in a sixth embodiment. FIG. 30A is a schematic plan view illustrating the arrangement of the color filters in the sixth embodiment. FIG. 30B is a schematic plan view illustrating the arrangement of the near-infrared absorption filters in the sixth embodiment. FIG. 30C is a schematic plan view illustrating the arrangement of the photoelectric conversion sections that are involved in the acquisition of a near-infrared image in the sixth embodiment.

FIG. 31 are diagrams illustrating the arrangement of the color filters and near-infrared absorption filters in the sixth embodiment in a case where the arrangement of the near-infrared absorption filters is limited.

DESCRIPTION OF EMBODIMENTS

Figure 1:
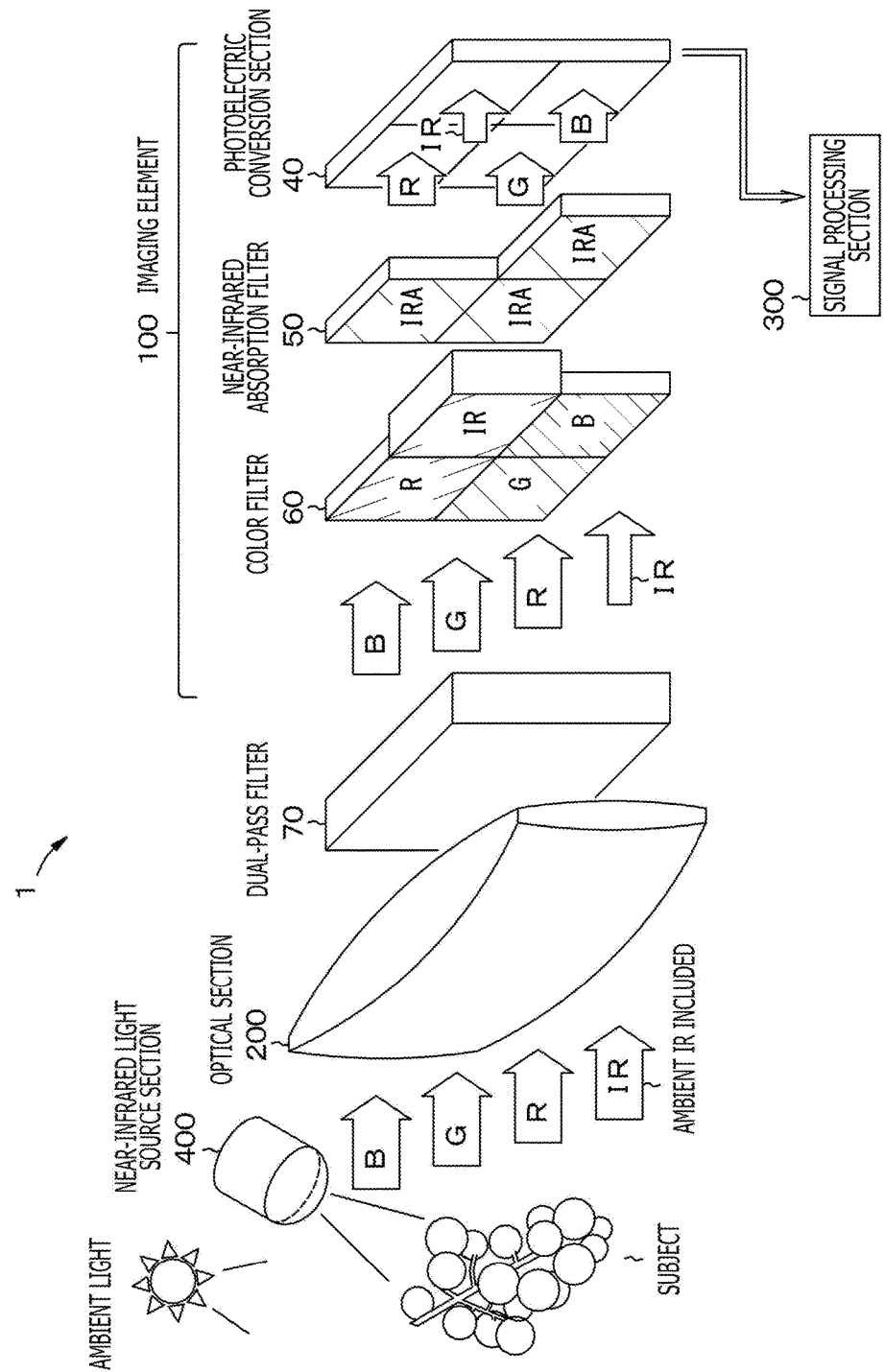
FIG. 1 is a schematic configuration diagram illustrating an imaging element according to a first embodiment and a camera system that uses such an imaging element.

The present disclosure will now be described on the basis of embodiments with reference to the accompanying drawings. The present disclosure is not limited to the embodiments. Various numerical values and materials mentioned in conjunction with the embodiments are illustrative and not restrictive. In the following description, identical elements and elements having the same functionality are designated by the same reference signs and will not be redundantly described. The description will be given in the following order.

1. Overall description of an imaging element according to a first aspect of the present disclosure and a camera system according to the first aspect of the present disclosure
2. First Embodiment
3. Second Embodiment
4. Third Embodiment
5. Fourth Embodiment 6. Fifth Embodiment
7. Sixth Embodiment
8. Seventh Embodiment
9. Eighth Embodiment
10. Other

[Overall Description of the Imaging Element According to the First Aspect of the Present Disclosure and the Camera System According to the First Aspect of the Present Disclosure]

As described above, the imaging element according to the first aspect of the present disclosure includes a plurality of photoelectric conversion sections. The photoelectric conversion sections are arrayed on a substrate to receive light incident through a dual-pass filter that has transmission bands for visible light and a predetermined range of near-infrared light. The photoelectric conversion sections include a visible light photoelectric conversion section and a near-infrared light photoelectric conversion section. The visible light photoelectric conversion section includes a red light photoelectric conversion section, a green light photoelectric conversion section, and a blue light photoelectric conversion section.

In the imaging element according to the first aspect of the present disclosure, the red light photoelectric conversion section, the green light photoelectric conversion section, the blue light photoelectric conversion section, and the near-infrared light photoelectric conversion section may be arrayed in a mosaic pattern.

In the imaging element according to the first aspect of the present disclosure including the above-mentioned various preferred embodiments, the green light photoelectric conversion section may be set to a higher placement ratio than the other photoelectric conversion sections.

In the imaging element according to the first aspect of the present disclosure including the above-mentioned various preferred embodiments, the near-infrared light photoelectric conversion section may include a white light photoelectric conversion section.

In the imaging element according to the first aspect of the present disclosure including the above-mentioned various preferred embodiments, the substrate may have a shallow trench structure for separating neighboring photoelectric conversion sections.

In the imaging element according to the first aspect of the present disclosure including the above-mentioned various preferred embodiments, a near-infrared absorption filter may be selectively disposed on a light incident surface of the photoelectric conversion sections in correspondence with the visible light photoelectric conversion section. Setup may be performed so that a near-infrared light absorption band provided by the near-infrared absorption filter includes a near-infrared light transmission band of the dual-pass filter and extends toward a short wavelength side.

In the above case, the near-infrared light absorption band provided by the near-infrared absorption filter may be set to include the near-infrared light transmission band of the dual-pass filter even in a case where the near-infrared light transmission band is shifted toward the short wavelength side due to oblique light incidence.

In the above case, the near-infrared absorption filter may include at least two different coloring substances that differ in near-infrared light absorption characteristics.

In the above case, the near-infrared absorption filter may include a first near-infrared absorption layer and a second near-infrared absorption layer. The first near-infrared absorption layer may include one of the two different coloring substances. The second near-infrared absorption layer may include the remaining one of the two different coloring substances. Alternatively, the near-infrared absorption filter may include a single layer.

In the imaging element according to the first aspect of the present disclosure including the above-mentioned various preferred embodiments, the near-infrared absorption filter may be selectively disposed in correspondence with the red light photoelectric conversion section, the green light photoelectric conversion section, and the blue light photoelectric conversion section. Alternatively, the near-infrared absorption filter may be selectively disposed for the blue light photoelectric conversion section in the visible light photoelectric conversion section.

In the above case, a color filter and the near-infrared absorption filter may be stacked over the light incident surface of the visible light photoelectric conversion section.

In the above case, at least a part of the near-infrared absorption filter may be embedded into an opening in a light-shielding layer that separates neighboring photoelectric conversion sections.

Further, the imaging element according to the first aspect of the present disclosure may include a near-infrared absorption layer that is disposed integrally with the dual-pass filter or disposed separately from the dual-pass filter. The near-infrared light transmission band of the dual-pass filter may be sandwiched between a first absorption band and a second absorption band. The first absorption band and the second absorption band may be provided for near-infrared light in the near-infrared absorption layer.

In the above case, the near-infrared absorption layer may include at least two different coloring substances that differ in near-infrared light absorption characteristics.

In the above case, the near-infrared absorption layer may include a first near-infrared absorption layer and a second near-infrared absorption layer. The first near-infrared absorption layer may include one of the two different coloring substances. The second near-infrared absorption layer may include the remaining one of the two different coloring substances. Alternatively, the near-infrared absorption layer may include a single layer containing the two different coloring substances that differ in near-infrared light absorption characteristics.

In a case where, for example, the first absorption band is positioned toward the long wavelength side as compared to the second absorption band, the near-infrared light transmission band of the dual-pass filter can be sandwiched between the first absorption band and the second absorption band by performing setup in such a manner that the short wavelength side of the first absorption band substantially coincides with or partly overlaps with the long wavelength side of the near-infrared light transmission band of the dual-pass filter, and that the long wavelength side of the second absorption band substantially coincides with or partly overlaps with the short wavelength side of the near-infrared light transmission band of the dual-pass filter.

As the imaging element according to the present disclosure including the above-described preferred embodiments and configurations and as the imaging element used in the camera system (these imaging elements may be hereinafter simply referred to as the "imaging elements or other similar elements according to the present disclosure"), for example, a CCD image sensor or a CMOS image sensor may be used. These image sensors may be of a front-illuminated type or of a back-illuminated type. Further, as a device using the imaging element or camera system according to the present disclosure, for example, a digital still camera, a digital video camera, a camcorder, a surveillance camera, a vehiclemounted camera, a smartphone camera, a user interface camera for gaming, and a biometric authentication camera may be used. These devices are capable of not only acquiring a normal visible light image but also simultaneously acquiring a near-infrared image.

As a substrate on which the photoelectric conversion sections are formed, a semiconductor substrate and, in particular, a silicon semiconductor substrate may be used. The silicon semiconductor substrate absorbs not only visible light but also light having a wavelength of approximately 1 μm. Therefore, photodiodes, phototransistors, and other photoelectric conversion elements formed on the silicon substrate are capable of photoelectrically converting not only visible light but also near-infrared light.

The dual-pass filter may include, for example, a cutoff band absorption layer for absorbing a boundary zone (cutoff band) between visible light and near-infrared light and a dielectric multilayer film having several ten to hundred and several ten layers for controlling the near-infrared light transmission band.

As a coloring substance included in the cutoff band absorption layer, the near-infrared absorption filter, and the near-infrared absorption layer, a well-known pigment or dye can be used. For example, a squarylium-based compound, a phthalocyanine-based compound, or a cyanine-based compound may be used. From the viewpoint of light resistance and heat resistance, it is particularly preferable that the squarylium-based compound be used.

As the color filter, a filter layer transmitting a specific wavelength, such as red, green, or blue, may be used. The color filter may include an organic material layer that uses a pigment, a dye, or other organic compound. In some cases, a complementary color filter transmitting a specific wavelength, such as cyan, magenta, or yellow, may be used.

A region between neighboring photoelectric conversion sections, for example, of the imaging element according to the present disclosure may include a light-shielding layer including, for example, chrome (Cr), copper (Cu), aluminum (Al), tungsten (W), or other metal material or a dielectric material. This configuration effectively prevents light from leaking into the neighboring photoelectric conversion sections. It should be noted that materials similar to the above-mentioned ones may be embedded in the shallow trench structure formed on the substrate.

The color filter, the near-infrared absorption filter, the near-infrared absorption layer, the cutoff band absorption layer, and, for example, an interlayer insulating layer and a planarization layer that are included, for example, in the imaging element can be formed on the basis of well-known methods such as various chemical vapor deposition methods (CVD methods), a coating method, and various physical vapor deposition methods (PVD methods). Further, as a patterning method, a combination of lithography technology and etching technology or a well-known method such as a liftoff method may be used.

For improved light collection efficiency, for example, the imaging element according to the present disclosure may be formed so that an on-chip lens (OCL) is disposed above the photoelectric conversion sections.

In a case where the interlayer insulating layer and the planarization layer are to be formed by using a transparent material, for example, an insulating material having no light absorption characteristics may be used. More specifically, the material to be used may be, for example, a $SiO_x$-based material (a material forming a silicon-based oxide film), a low-permittivity insulating material such as SiN, SiON, SiOC, SiOF, SiCN, or organic SOG, polyimide-based resin, or fluorine-based resin. This also holds true for the OCL.

Conditions specified by various equations in this specification are met not only in a case where the equations are strictly established in a mathematical manner, but also in a case where the equations are substantially established. As regards the establishment of the equations, various variations resulting from the design or manufacture of the imaging element or the camera system are permitted.

In the following description, graphs are referenced to explain about, for example, spectral characteristics. However, these graphs are schematic and are not indicative, for example, of accurate spectral characteristics. The shapes of the graphs are also schematic.

[First Embodiment]

A first embodiment relates to an imaging element according to the present disclosure and to a camera system that uses such an imaging element.

Figure 2:
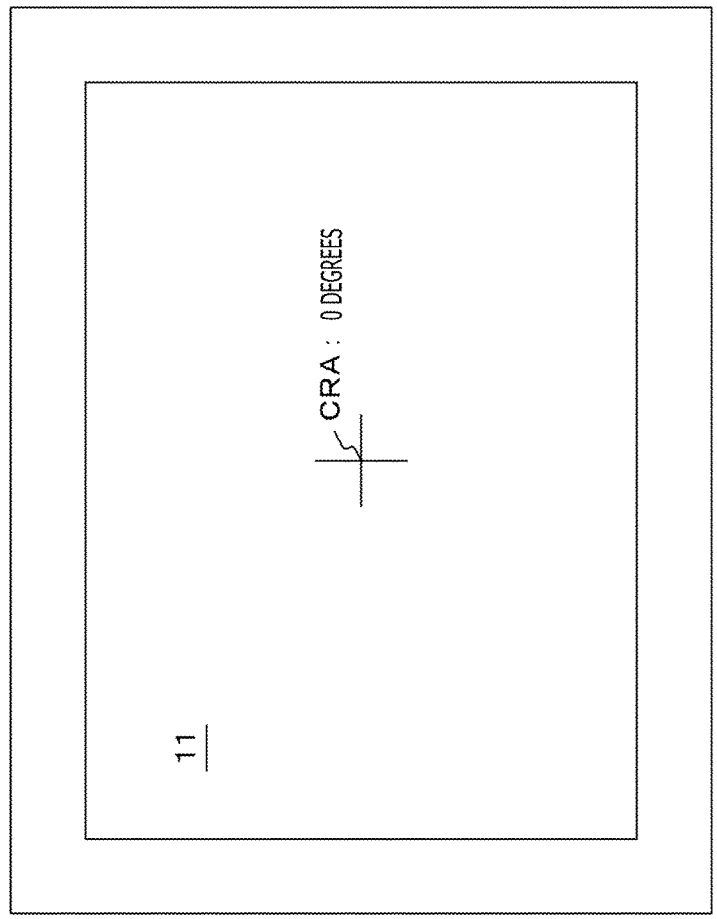
FIG. 2 is a schematic plan view illustrating, for example, an imaging area of the imaging element.

FIG. 1 is a schematic configuration diagram illustrating the imaging element according to the first embodiment and the camera system that uses the imaging element. FIG. 2 is a schematic plan view illustrating, for example, an imaging area of the imaging element.

The camera system 1 includes an optical section (imaging lens) 200, an imaging element 100, and a signal processing section 300. The optical section 200 forms an image of a subject. The imaging element 100 includes a plurality of photoelectric conversion sections 40 that are arrayed on a substrate to receive light incident through a dual-pass filter 70 having transmission bands for visible light and a predetermined range of near-infrared light. The signal processing section 300 processes signals from the photoelectric conversion sections 40.

The photoelectric conversion sections 40 include a visible light photoelectric conversion section and a near-infrared light photoelectric conversion section.

The visible light photoelectric conversion section 40 includes a red light photoelectric conversion section, a green light photoelectric conversion section, and a blue light photoelectric conversion section. The red light photoelectric conversion section, the green light photoelectric conversion section, the blue light photoelectric conversion section, and the near-infrared light photoelectric conversion section are arrayed in a mosaic pattern.

A near-infrared absorption filter 50 is selectively disposed on a light incident surface of the photoelectric conversion sections 40 in correspondence with the visible light photoelectric conversion section 40. More specifically, the near-infrared absorption filter 50 is selectively disposed in correspondence with the red light photoelectric conversion section, the green light photoelectric conversion section, and the blue light photoelectric conversion section.

Setup is performed so that a near-infrared light absorption band provided by the near-infrared absorption filter 50 includes a near-infrared light transmission band of the dual-pass filter 70 and extends toward a short wavelength side. More details will be given later with reference to FIGS. 11 to 17.

Light transmitted through the dual-pass filter 70 reaches the photoelectric conversion sections 40 through a color filter 60 and the near-infrared absorption filter 50. The imaging element 100 includes, for example, mega pixels. For convenience of explanation, however, FIG. 1 depicts four pixels that form one unit. The sign "IRA," which is assigned to the near-infrared absorption filter 50, denotes "near-infrared absorption." This also holds true for the other drawings. In the imaging area 11 depicted in FIG. 2, the photoelectric conversion sections 40, the color filter 60, and the near-infrared absorption filter 50 are disposed, for example, in an array. It should be noted that the array is not depicted in FIG. 2. The chief ray angle is 0 degrees at the center of the imaging area 11. The longer the distance from the center of the imaging area 11, the greater the chief ray angle.

Figure 3:
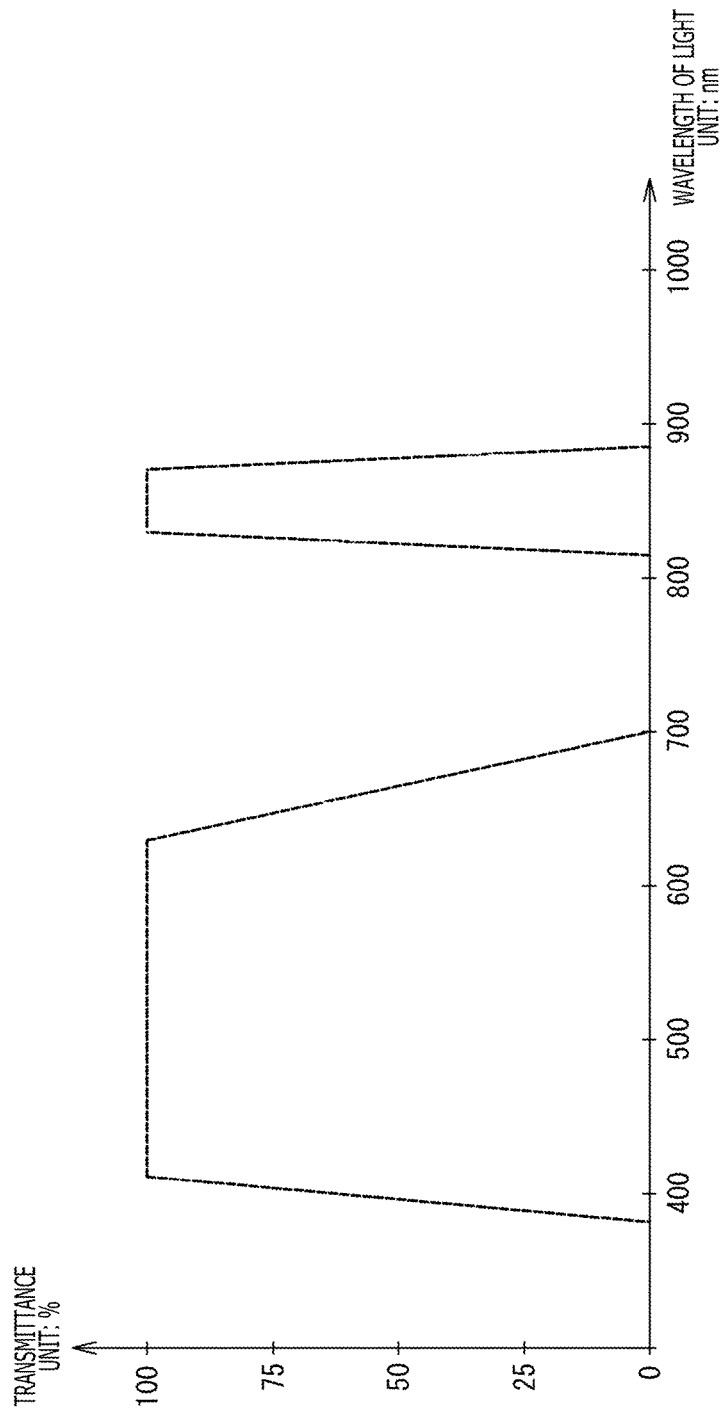
FIG. 3 is a schematic graph illustrating the spectral transmittance of a dual-pass filter.

The dual-pass filter 70 depicted in FIG. 1 is configured so that the cutoff band absorption layer absorbs the wavelength region between 650 nm and 750 nm and that the dielectric multilayer film controls the spectral characteristics of the near-infrared light transmission band. FIG. 3 is a schematic graph illustrating the spectral transmittance of the dual-pass filter. The following description assumes that the center of the near-infrared light transmission band of the dual-pass filter 70 has a wavelength of 850 nm, and that the width of the near-infrared light transmission band is set to approximately 80 nm. However, the present disclosure is not limited to such a configuration.

Figure 4:
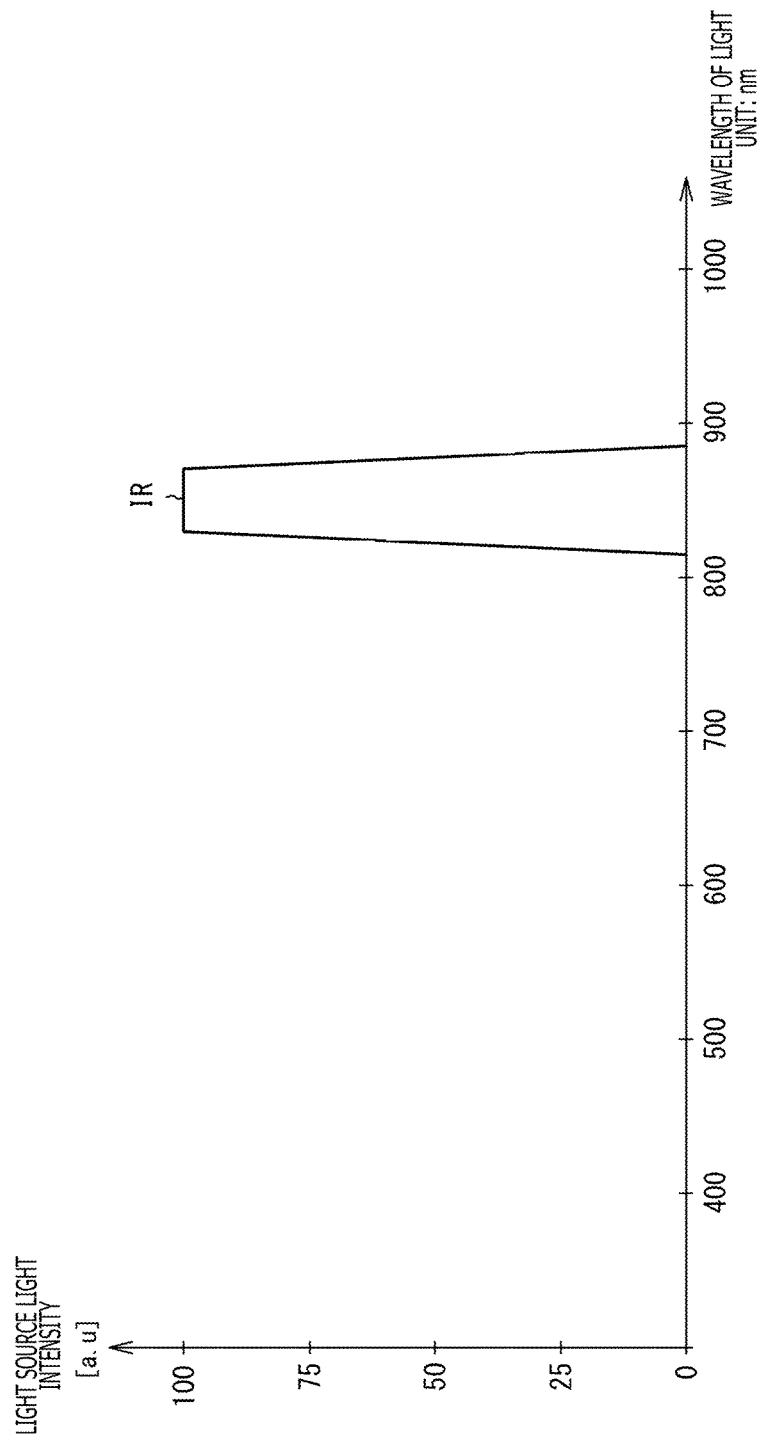
FIG. 4 is a schematic graph illustrating the emission spectrum of a near-infrared light source section.

The camera system 1 depicted in FIG. 1 further includes a near-infrared light source section 400 that includes, for example, an LED for irradiating near-infrared light within a certain wavelength range onto the subject. An exemplary spectrum of the near-infrared light source section 400 is depicted in FIG. 4. The typical emission wavelength bandwidth of an available near-infrared LED is approximately several ten nm. It is assumed that the center of the emission wavelength of such a near-infrared LED coincides with the center of the near-infrared light transmission band of the dual-pass filter 70. On the basis of the ambient light including near-infrared light and of the near-infrared light within a predetermined wavelength range from the near-infrared light source section 400, light reflected from the subject is incident on the optical section 200.

It should be noted that the near-infrared light transmission band of the dual-pass filter 70 and the emission wavelength of the near-infrared light source section 400 should be selected in accordance with the spectral reflectance characteristics of an observation target. For iris authentication, near-infrared light having a wavelength of approximately 800 to 900 nm is used.

First of all, photoelectric conversion of red, green, and blue light will be described. The dual-pass filter 70 functions so that visible light within a predetermined range and near-infrared light within a predetermined range, which are included in the light reflected from the subject, reach the color filter 60 and are subjected to color separation.

Figure 5:
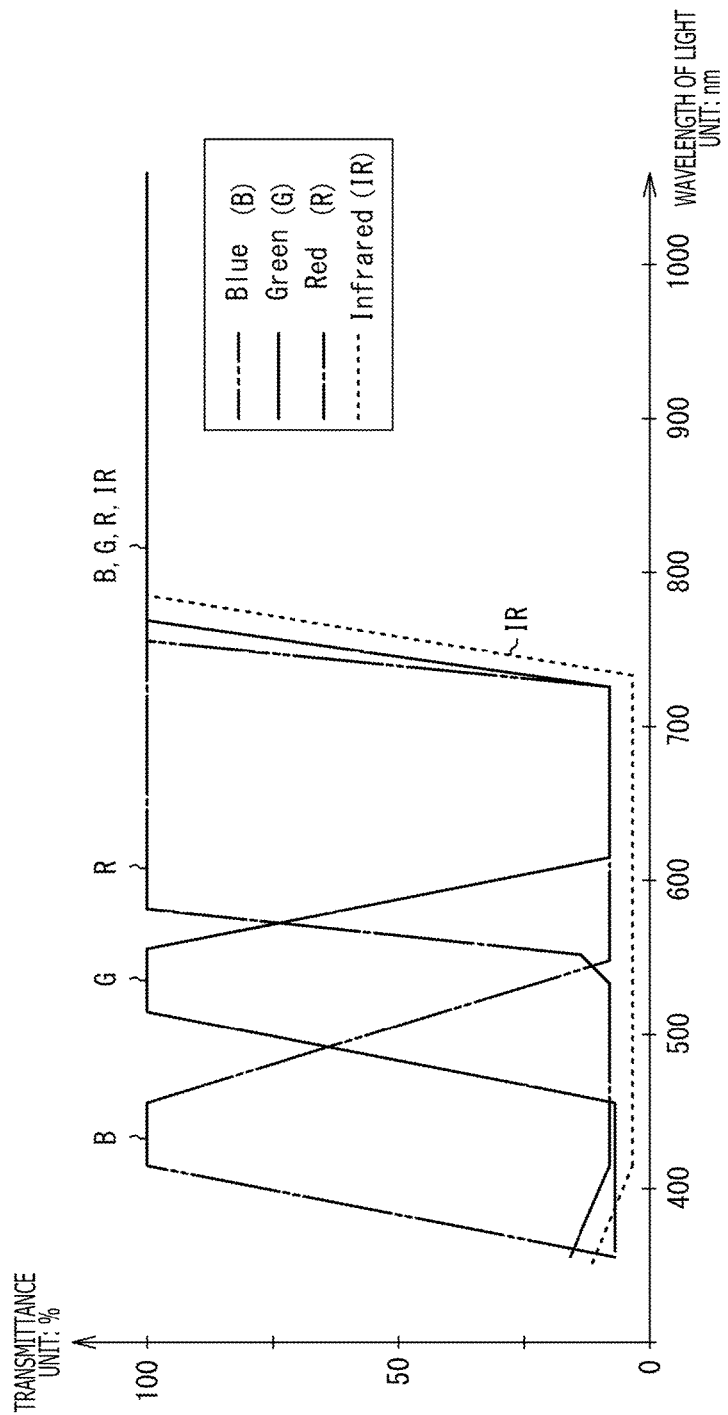
FIG. 5 is a schematic graph illustrating the spectral transmittance of color filters.

FIG. 5 is a schematic graph illustrating the spectral transmittance of the color filters. The illustrated spectral transmittance is obtained in a case where red, green, blue, and near-infrared light color filters are deposited to form a film on a transparent base material. According to the studies conducted by the inventors of the present disclosure, it is confirmed that the film thickness of a near-infrared light color filter needs to be approximately two times the film thickness of the other color filters in order to permit the near-infrared light color filter to sufficiently block the visible light. As indicated in the drawing, color filters marketed for imaging elements generally exhibit a transmittance of approximately 100 percent at wavelengths longer than 800 nm.

Consequently, light transmitted through a red color filter (which may be designated by the reference sign $60_R$) includes near-infrared light within a predetermined range in addition to red visible light, light transmitted through a green color filter (which may be designated by the reference sign $60_G$) includes near-infrared light within a predetermined range in addition to green visible light, and light transmitted through a blue color filter (which may be designated by the reference sign $60_B$) includes near-infrared light within a predetermined range in addition to blue visible light.

Thus, light transmitted through the red, green, and blue color filters 60 is passed to near-infrared absorption filters 50 disposed in correspondence with red, green, and blue light photoelectric conversion sections 40 in order to reduce a near-infrared light component, and then conveyed to the photoelectric conversion sections 40 and subjected to photoelectric conversion. Accordingly, signals representative of the intensities of red light, green light, and blue light, which are included in the light reflected from the subject, are outputted from the red, green, and blue light photoelectric conversion sections 40.

The photoelectric conversion of near-infrared light will now be described. A color filter corresponding to the near-infrared light photoelectric conversion section 40 (which may be designated by the reference sign $60_{IR}$) includes a visible light absorbing material that absorbs visible light and transmits near-infrared light. Light transmitted through the dual-pass filter 70 is passed to the color filter $60_{IR}$ in order to reduce a visible light component, and then conveyed to the near-infrared light photoelectric conversion section 40 and subjected to photoelectric conversion.

In order to facilitate the understanding of the present disclosure, a configuration in which the near-infrared light absorption band provided by the near-infrared absorption filter substantially coincides with the near-infrared light transmission band of the dual-pass filter 70 is described below as a reference example. Further, some necessary considerations are also described below.

The near-infrared absorption filters may include, for example, one or several layers containing a coloring substance or include a dielectric multilayer film having several tens of layers. However, from the viewpoint where the near-infrared absorption filters are selectively disposed in correspondence with the red, green, and blue light photoelectric conversion sections 40, it is preferable that the near-infrared absorption filters include one or several layers containing a coloring substance (infrared absorbing material). Further, it is preferable from the viewpoint of manufacture that the thickness of the near-infrared absorption filters be substantially equal to the thickness of the color filters 60 (e.g., several hundred nm to one μm).

Figure 6:
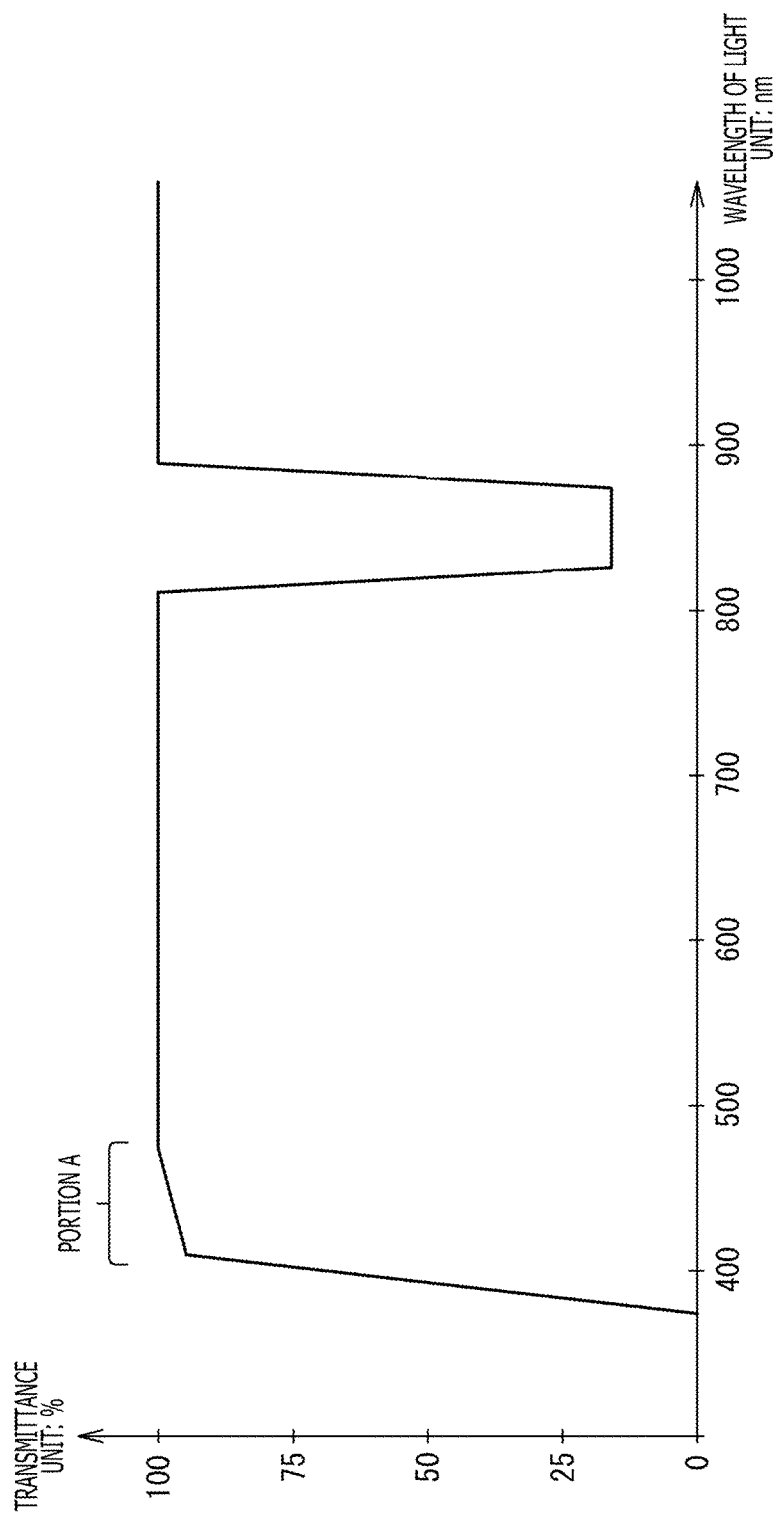
FIG. 6 is a schematic graph illustrating the spectral transmittance of near-infrared absorption filters cited as a reference example.

In a case where the near-infrared absorption filters are formed, for example, by spin-coating a material containing a coloring substance, a material such as cyanine, phthalocyanine, or squarylium may be used as a coloring substance. FIG. 6 is a schematic graph illustrating the spectral transmittance of the near-infrared absorption filters formed in the above manner. The center wavelength of the near-infrared light absorption band can be adjusted by changing the molecular design of the coloring substance, for example, the molecular framework of the coloring substance and the configuration of substituents.

Studies conducted by the inventors in relation to the above-mentioned coloring substance have revealed that visible region absorption occurs due to the main framework of a material (portion A in FIG. 6), and that an increase in density or film thickness causes a visible region transmittance deterioration of several ten percent and incurs significant sensitivity degradation of the visible region.

Consequently, it has been revealed that the coloring substance density and film thickness of a layer containing an infrared absorbing material need to be set within a permissible range of visible region transmittance deterioration. As a result, it has been found that the infrared absorption rate remains at approximately 50% to 90%. Further, it has been found that the absorption wavelength bandwidth of the aforementioned infrared absorbing material is approximately 50 nm when defined in half width and at the same level as the near-infrared light transmission bandwidth of the dual-pass filter 70.

Figure 7:
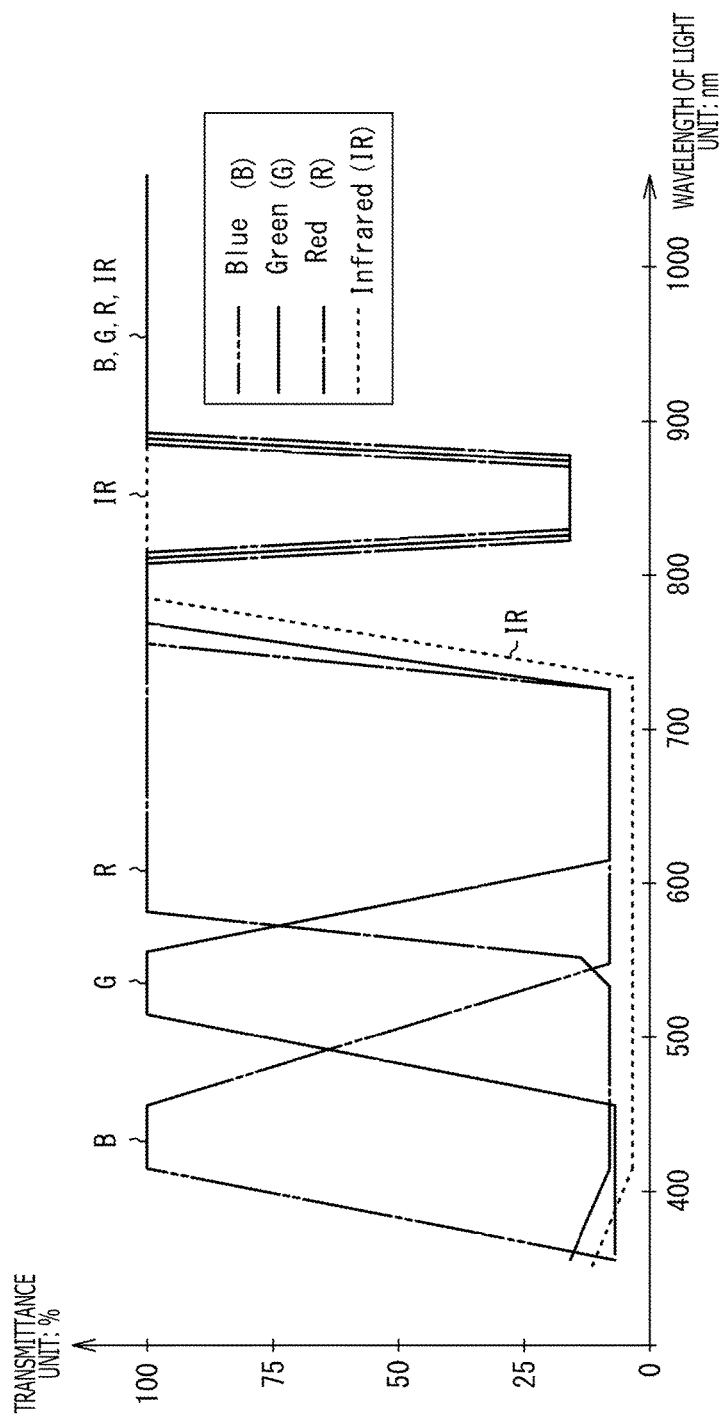
FIG. 7 is a schematic graph illustrating the spectral transmittance of a combination of the color filters and the near-infrared absorption filters cited as the reference example.
Figure 8:
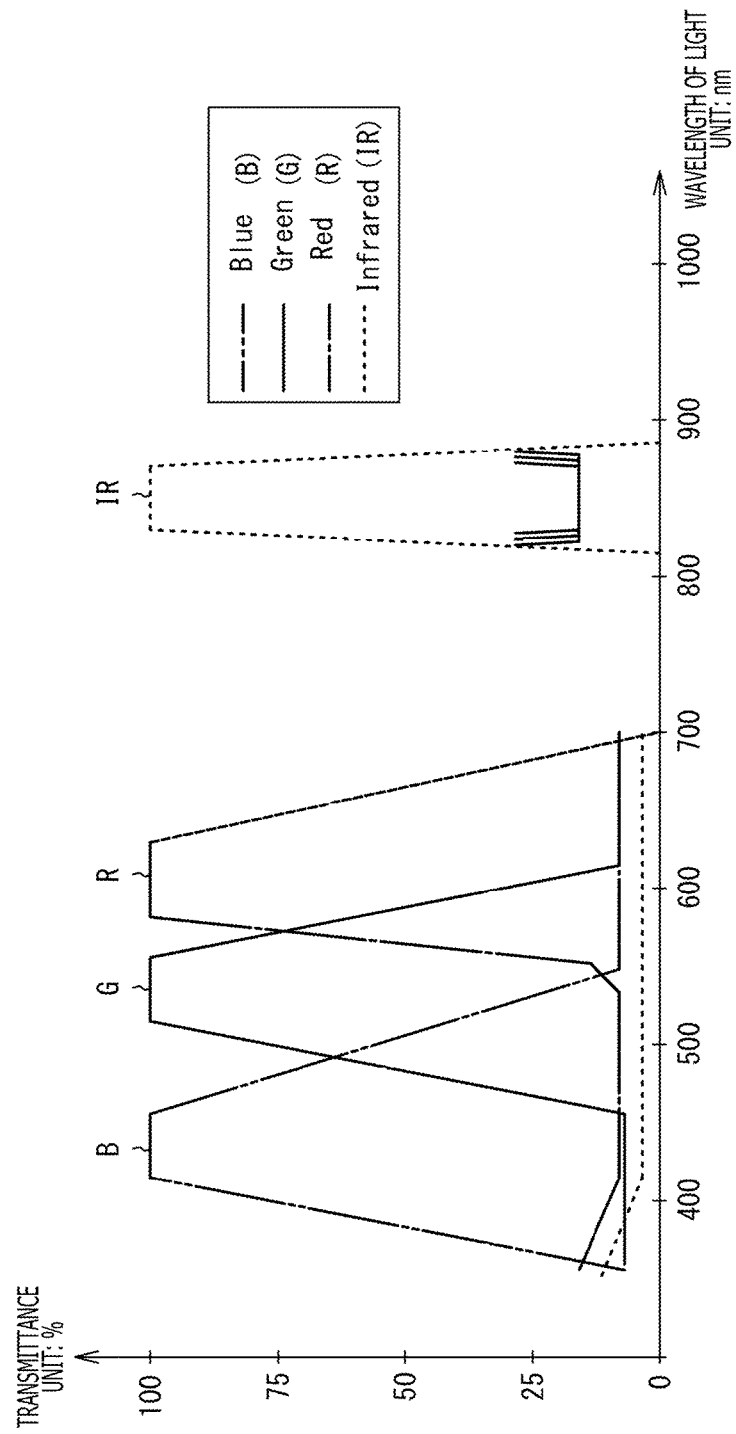
FIG. 8 is a schematic graph illustrating the spectral transmittance of a combination of the dual-pass filter, the color filters, and the near-infrared absorption filters cited as the reference example.

When the near-infrared absorption filters cited as the reference example having characteristics depicted in FIG. 6 are combined with the color filters 60 having the characteristics depicted in FIG. 5, the spectral transmittance is expressed as depicted in FIG. 7. Further, when the dual-pass filter 70 having the characteristics depicted in FIG. 3 is additionally combined, the spectral characteristics are expressed as depicted in FIG. 8.

Figure 9:
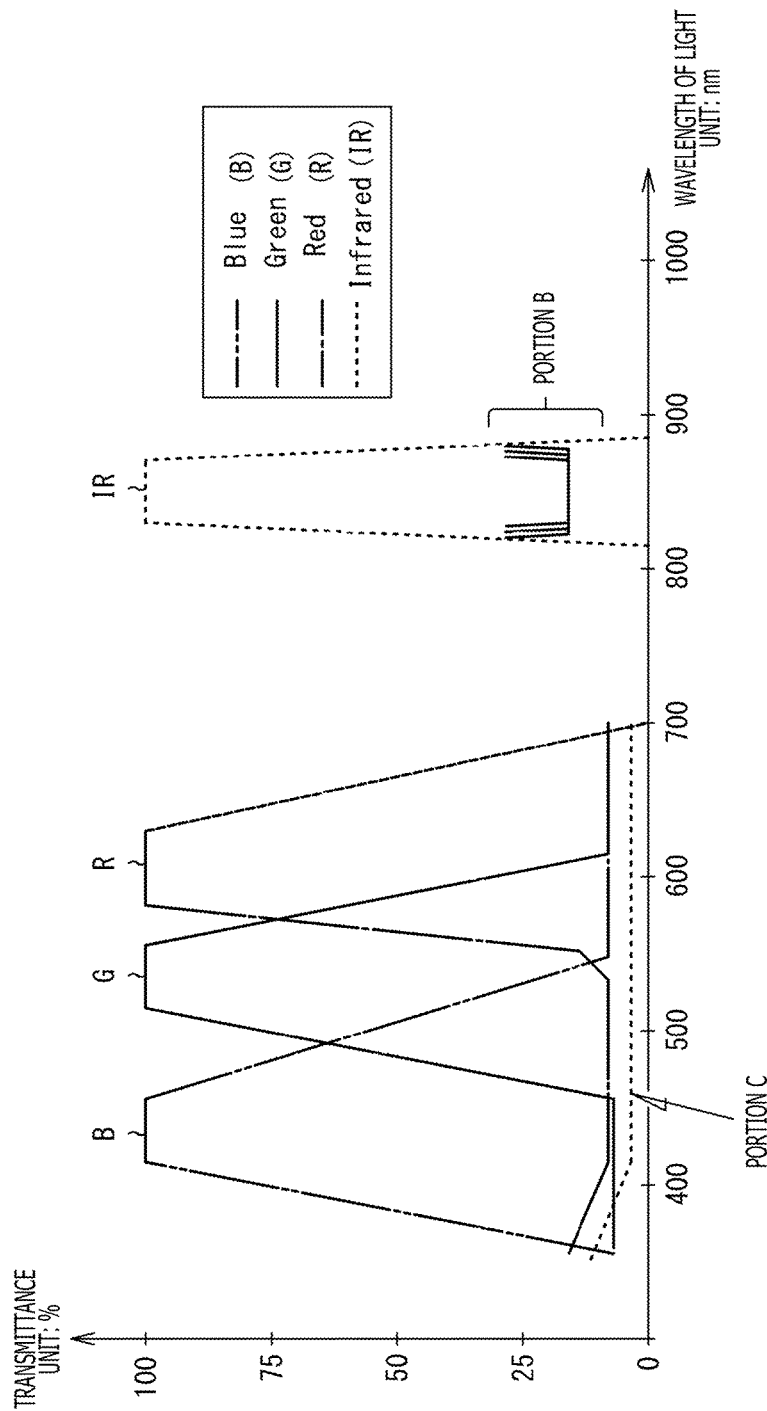
FIG. 9 is a schematic graph illustrating the overall spectral transmittance at the center of the imaging area of the imaging element in a case where the near-infrared absorption filters cited as the reference example are used.

A mixed color resulting from near-infrared light during the use of the near-infrared absorption filters cited as the reference example and its elimination will now be described. FIG. 9 is a schematic graph illustrating the overall spectral transmittance at the center of the imaging area of the imaging element (i.e., a portion having a CRA of 0 degrees) in a case where the near-infrared absorption filters cited as the reference example are used. The graph itself is similar to the one depicted in FIG. 8.

In a case where the near-infrared absorption filters cited as the reference example are used, portion B in FIG. 9 is a mixed color component that is obtained when visible light is mixed with near-infrared light. Further, portion C in FIG. 9 is a mixed color component that is obtained when near-infrared light is mixed with visible light. Here, it is assumed that the transmittance of portion B is 20%, for example. The above-mentioned mixed color can be eliminated by performing matrix computation.

For example, an original signal from the red light photoelectric conversion section 40 is represented by the sign $R_{ori}$, an original signal from the green light photoelectric conversion section 40 is represented by the sign $G_{ori}$, an original signal from the blue light photoelectric conversion section 40 is represented by the sign $B_{ori}$, and an original signal from the near-infrared light photoelectric conversion section 40 is represented by the sign $IR_{ori}$. Further, a corrected red light signal is represented by the sign $R_{cvt}$, a corrected green light signal is represented by the sign $G_{cvt}$, a corrected blue light signal is represented by the sign $B_{cvt}$, and a corrected near-infrared light signal is represented by the sign $IR_{cvt}$. The corrected signals can be obtained by performing matrix computation in the signal processing section 300 as indicated in Equation (1) below.

$$\begin{bmatrix} R_{cvt} \\ G_{cvt} \\ B_{cvt} \\ IR_{cvt} \end{bmatrix} = \begin{bmatrix} 1.02 & 0 & 0 & -0.20 \\ 0.02 & 1.01 & 0 & -0.20 \\ 0.03 & 0.01 & 1.00 & -0.20 \\ -0.12 & 0 & -0.05 & 1.02 \end{bmatrix} \begin{bmatrix} R_{ori} \\ G_{ori} \\ B_{ori} \\ IR_{ori} \end{bmatrix} \quad (1)$$

When attention is paid, for example, to the corrected red light signal $R_{cvt}$, the following computation is performed:

$$R_{cvt} = 1.02 \times R_{ori} - 0.2 \times IR_{ori}$$

This indicates that the output of the near-infrared light photoelectric conversion section 40 will be reduced by 20 percent.

If the transmittance of portion B in FIG. 9 is 100%, the following computation needs to be performed in order to eliminate a mixed color resulting from near-infrared light:

$$R_{cvt} = 1.02 \times R_{ori} - 1.0 \times IR_{ori}$$

This indicates that the output of the near-infrared light photoelectric conversion section 40 will be reduced to zero. However, the signal $R_{ori}$ and the signal $IR_{ori}$ each include noise induced by photoelectric conversion. Therefore, the level of noise included in $R_{cvt}$ is substantially doubled in a qualitative sense so that the S/N ratio deteriorates by approximately 6 dB. In a case where imaging is performed, for example, under ambient light that includes a relatively large amount of near-infrared light such as halogen lamp light or outdoor light, several dB deterioration caused by the above correction computation poses an image equality problem.

Meanwhile, in the first embodiment, computation is performed so as to reduce the output of the near-infrared light photoelectric conversion section 40 by 20 percent. Therefore, the noise level is merely increased approximately 1.2 times. Consequently, it is possible to suppress S/N ratio deterioration caused by the correction computation.

Further, when attention is paid to the corrected near-infrared light signal $IR_{cvt}$, computation is performed as indicated by the equation $IR_{cvt} = -0.12 \times R_{ori} - 0.05 \times B_{ori} + 1.02 \times R_{ori}$. This eliminates a visible light component indicated by portion B in FIG. 9.

The mixed color resulting from near-infrared light during the use of the near-infrared absorption filters cited as the reference example and its elimination have been described. In reality, however, a color difference occurs between the center and periphery of a screen due to the CRA difference between the center and periphery of the imaging element 100. A detailed description is given below.

The spectral characteristics of the near-infrared region of the dual-pass filter 70 are controlled by a dielectric multilayer film. Therefore, the spectral characteristics of the near-infrared region vary with the angle of incidence of light. In a qualitative sense, the spectral characteristics shift toward the short wavelength side due to oblique incidence. In a case where a typical multilayer film design is adopted, the spectral characteristics shift by approximately 1 nm toward the short wavelength side when the angle of incidence increases by 1 degree.

Figure 10:
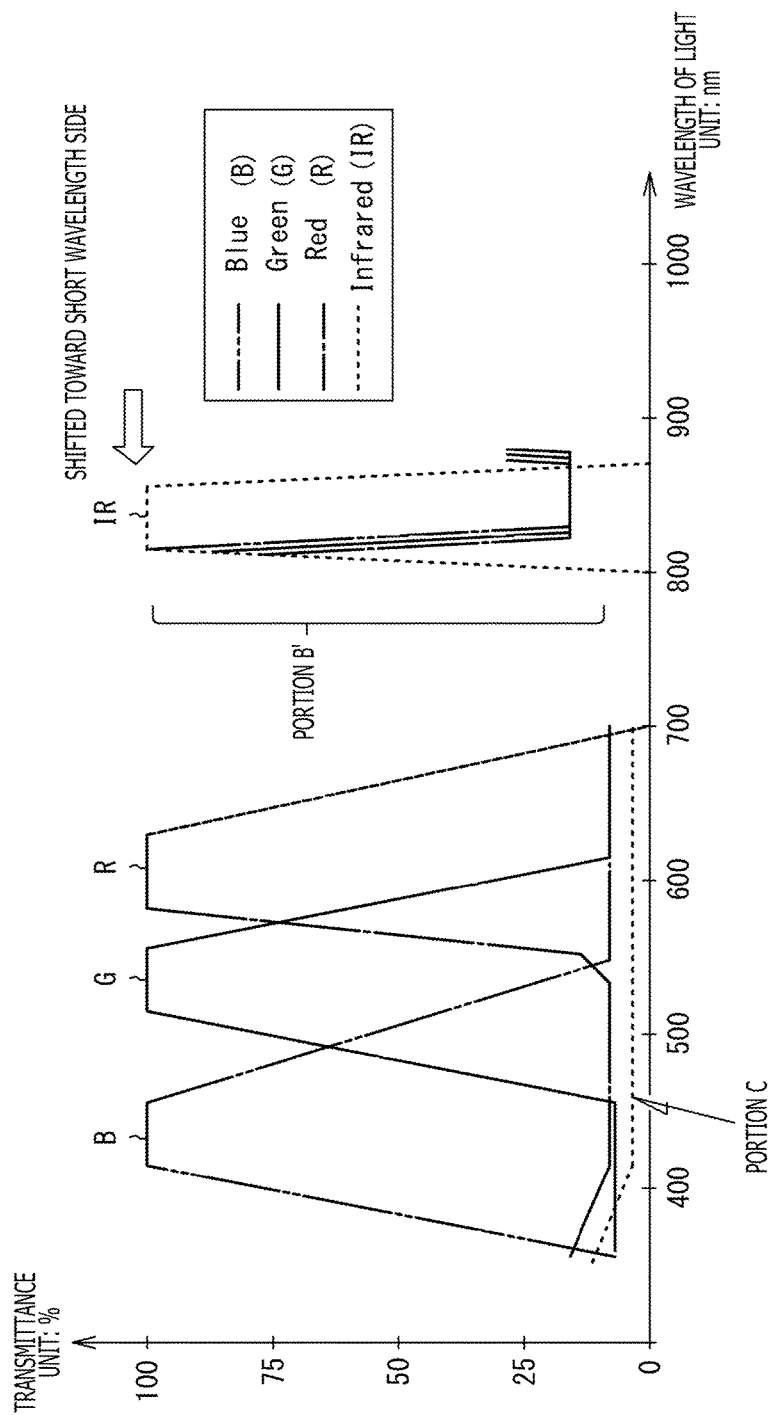
FIG. 10 is a schematic graph illustrating the overall spectral transmittance at a part of the imaging area of the imaging element where the CRA is 30 degrees in the case where the near-infrared absorption filters cited as the reference example are used.

FIG. 10 is a schematic graph illustrating the overall spectral transmittance at a part of the imaging area of the imaging element where the CRA is 30 degrees in a case where the near-infrared absorption filters cited as the reference example are used.

As is obvious from a comparison between FIGS. 9 and 10, the mixed color component that is obtained when visible light is mixed with near-infrared light as indicated by portion B' in FIG. 10 is greater than the mixed color component indicated by portion B in FIG. 9. Therefore, an insufficient correction results in a case where matrix computation is performed as indicated in Equation (1) above. The result of simulation indicates that the ΔEab difference in a 24-color Macbeth chart between a CRA of 0 degrees and a CRA of 30 degrees is 17 at maximum in patch No. 16 and 5 on the average of 24 colors. This represents a level at which a distinct color difference is recognized between the center and periphery of a screen.

The fact that a color difference arises from the difference in CRA during the use of a configuration cited as the reference example has been described.

In order to resolve the color difference caused by the above-described difference in CPA, the first embodiment is configured so that the near-infrared light absorption band provided by the near-infrared absorption filter 50 includes the near-infrared light transmission band of the dual-pass filter 70 and extends toward the short wavelength side. More specifically, the near-infrared light absorption band provided by the near-infrared absorption filter 50 includes the near-infrared light transmission band of the dual-pass filter 70 even in a case where the near-infrared light transmission band is shifted toward the short wavelength side due to oblique incidence of light.

The first embodiment will now be described in detail with reference to FIGS. 11 to 17.

In the first embodiment, the near-infrared absorption filters 50 include at least two different coloring substances that differ in near-infrared light absorption characteristics. Therefore, setup can be performed so that the near-infrared light absorption band provided by the near-infrared absorption filters 50 includes the near-infrared light transmission band of the dual-pass filter 70 and extends toward the short wavelength side.

Figure 11:
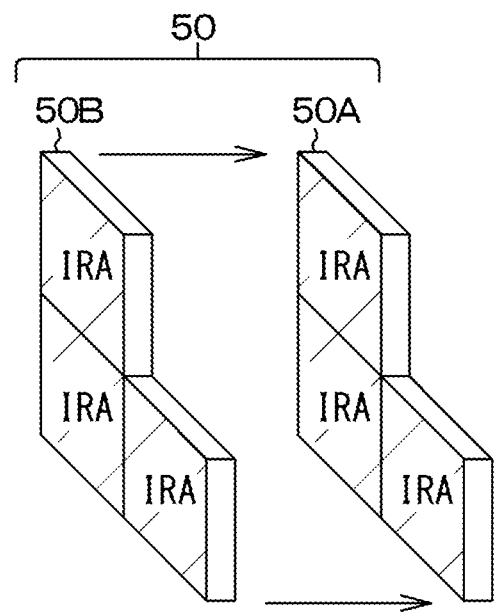
FIG. 11 is a schematic perspective view illustrating the relation between a first near-infrared absorption layer and a second near-infrared absorption layer that are included in a near-infrared absorption filter used in the first embodiment.

More specifically, as depicted in FIG. 11, the near-infrared absorption filter 50 includes a first near-infrared absorption layer 50A and a second near-infrared absorption layer 50B. The first near-infrared absorption layer 50A includes one of the two different coloring substances. The second near-infrared absorption layer 50B includes the remaining one of the two different coloring substances.

Figure 12:
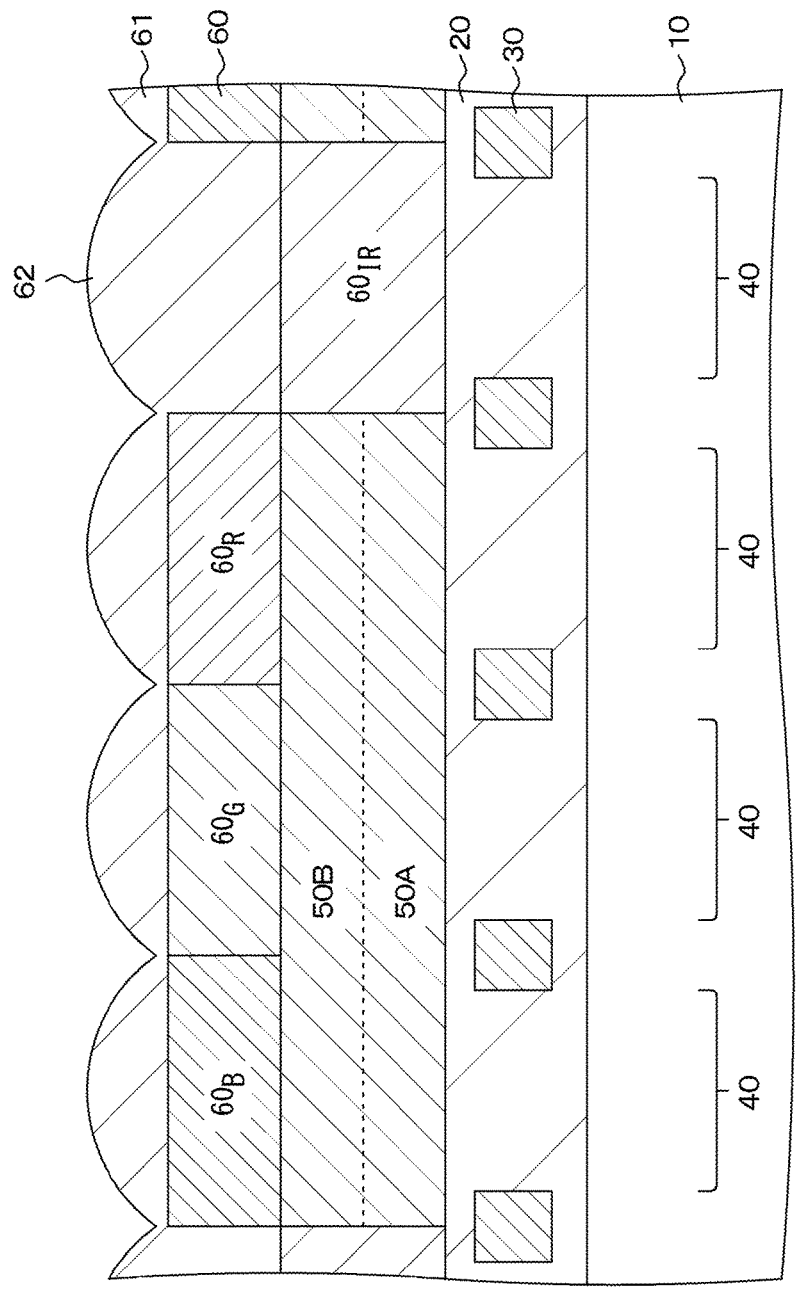
FIG. 12 is a schematic partial end view of the imaging element according to the first embodiment.

FIG. 12 is a schematic partial end view of the imaging element according to the first embodiment. For convenience of illustration, it is assumed that red, green, blue, and near-infrared light elements are arrayed in a row. The color filters 60 and the near-infrared absorption filters 50 are stacked over the light incident surface of the visible light photoelectric conversion section 40.

The photoelectric conversion sections 40 are formed over a semiconductor substrate 10 that includes, for example, silicon. It should be noted that photodiodes and other elements included in the photoelectric conversion sections 40 and the wiring and other elements connected to the photoelectric conversion sections 40 are omitted from the drawing. The reference sign 30 denotes a light-shielding layer that is disposed between the neighboring photoelectric conversion sections 40. The reference sign 20 denotes a planarization layer that covers, for example, the light-shielding layer 30. The first near-infrared absorption layer 50A and the second near-infrared absorption layer 50B, which are included in the near-infrared absorption filters 50, are disposed at positions corresponding to the red, green, and blue light photoelectric conversion sections 40. Additionally, the red, green, and blue color filters 60 (60$_R$, 60$_G$, 60$_B$) are formed over the near-infrared absorption filters 50. The near-infrared light color filter (60$_{IR}$) is formed over the planarization layer 20. Further, a transparent material layer 61 is formed to cover the entire surface of the color filters 60. The surface of the transparent material layer 61 is shaped like a lens corresponding to each photoelectric conversion section 40 in order to form an on-chip lens 62. Although not depicted in the drawing, the dual-pass filter 70 is disposed above the on-chip lens 62.

The color filters 60 and the near-infrared absorption filters 50 can be formed by configuring their material layers through the use of materials having lithographic characteristics and performing patterning, for example, by making exposures. Alternatively, the color filters 60 and the near-infrared absorption filters 50 can be formed by forming a photoresist film over an upper material layer, selectively keeping the photoresist film by lithography, and performing patterning by dry etching or other processing means.

Figure 13:
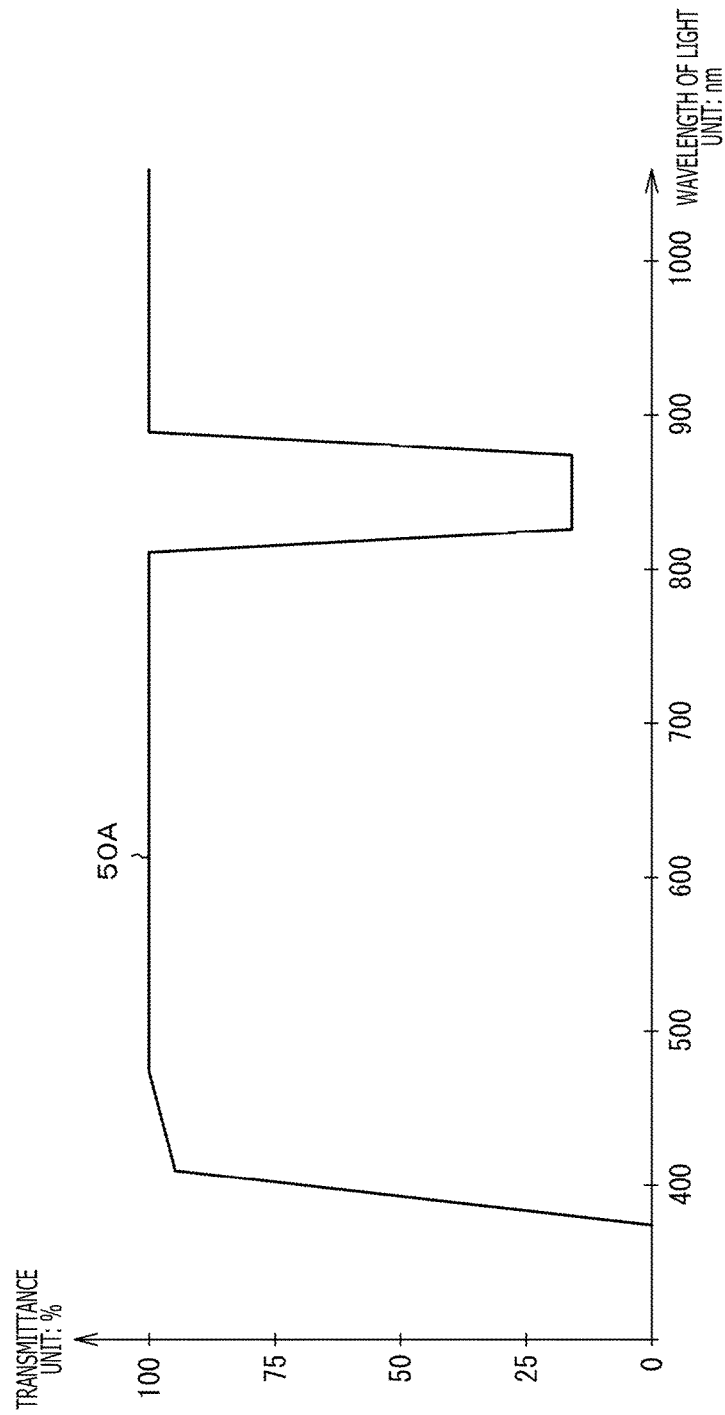
FIG. 13 is a schematic graph illustrating the spectral transmittance of the first near-infrared absorption layer.
Figure 14:
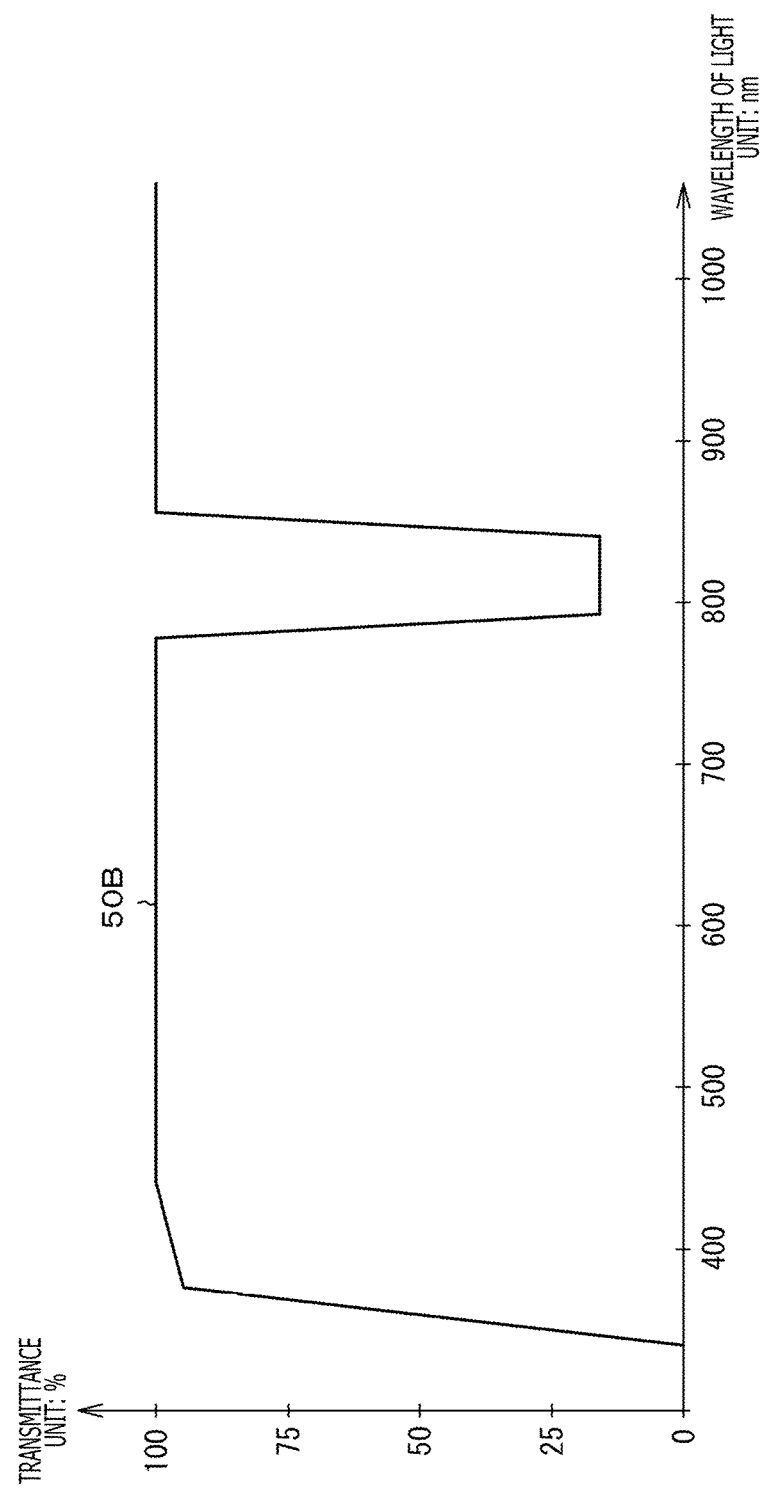
FIG. 14 is a schematic graph illustrating the spectral transmittance of the second near-infrared absorption layer.

FIG. 13 is a schematic graph illustrating the spectral transmittance of the first near-infrared absorption layer. The spectral characteristics are set in a similar manner to those depicted in FIG. 6, and the center of the near-infrared light absorption band is set, for example, to approximately 850 nm. FIG. 14 is a schematic graph illustrating the spectral transmittance of the second near-infrared absorption layer. In the case depicted in the drawing, the center of the near-infrared light absorption band is shifted by approximately 30 nm toward the short wavelength side.

Figure 15:
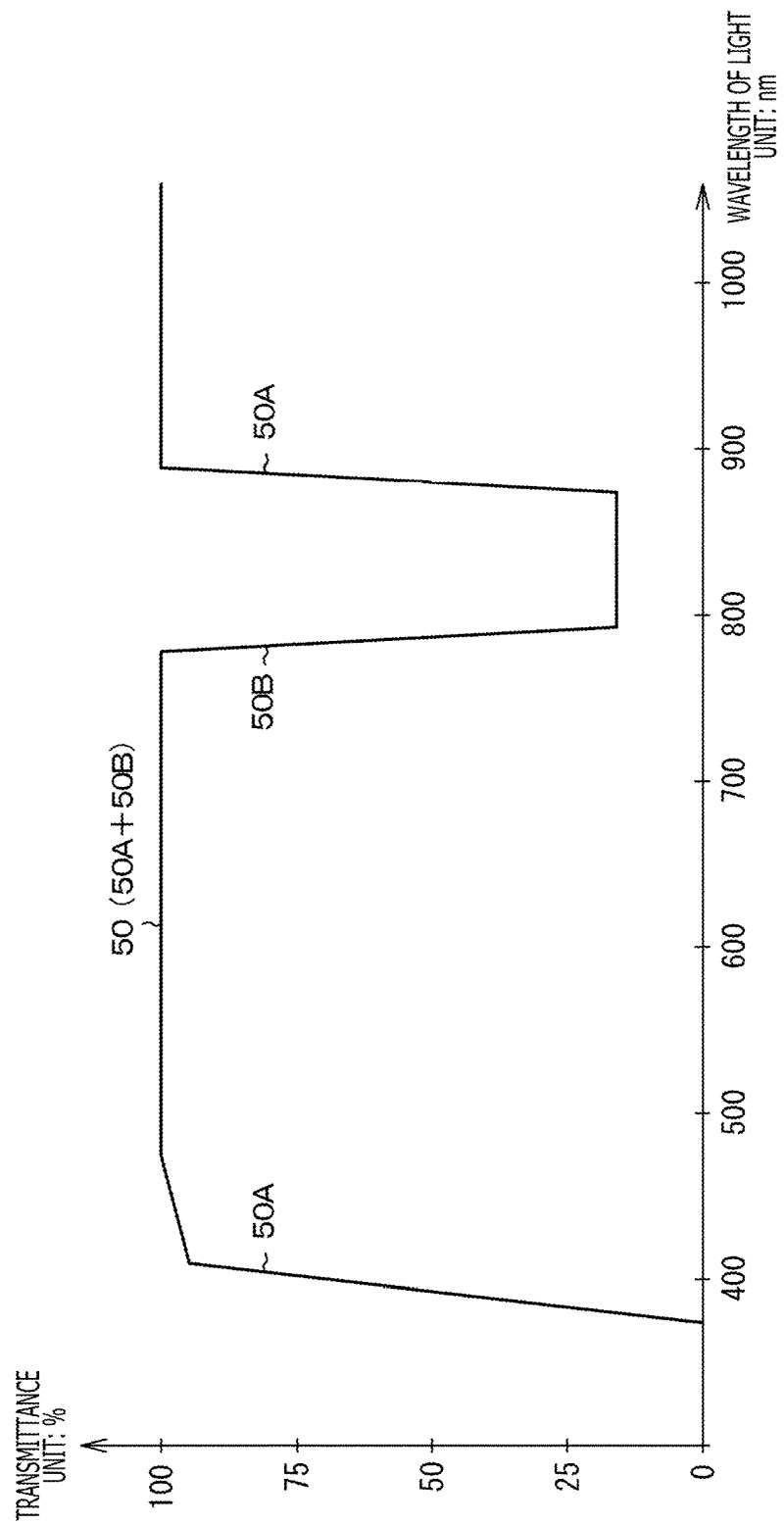
FIG. 15 is a schematic graph illustrating the spectral transmittance of the near-infrared absorption filters used in the first embodiment.

The spectral transmittance of the near-infrared absorption filters 50 in the first embodiment is equivalent to the sum of those depicted in FIGS. 13 and 14 and expressed as depicted in FIG. 15.

Figure 16:
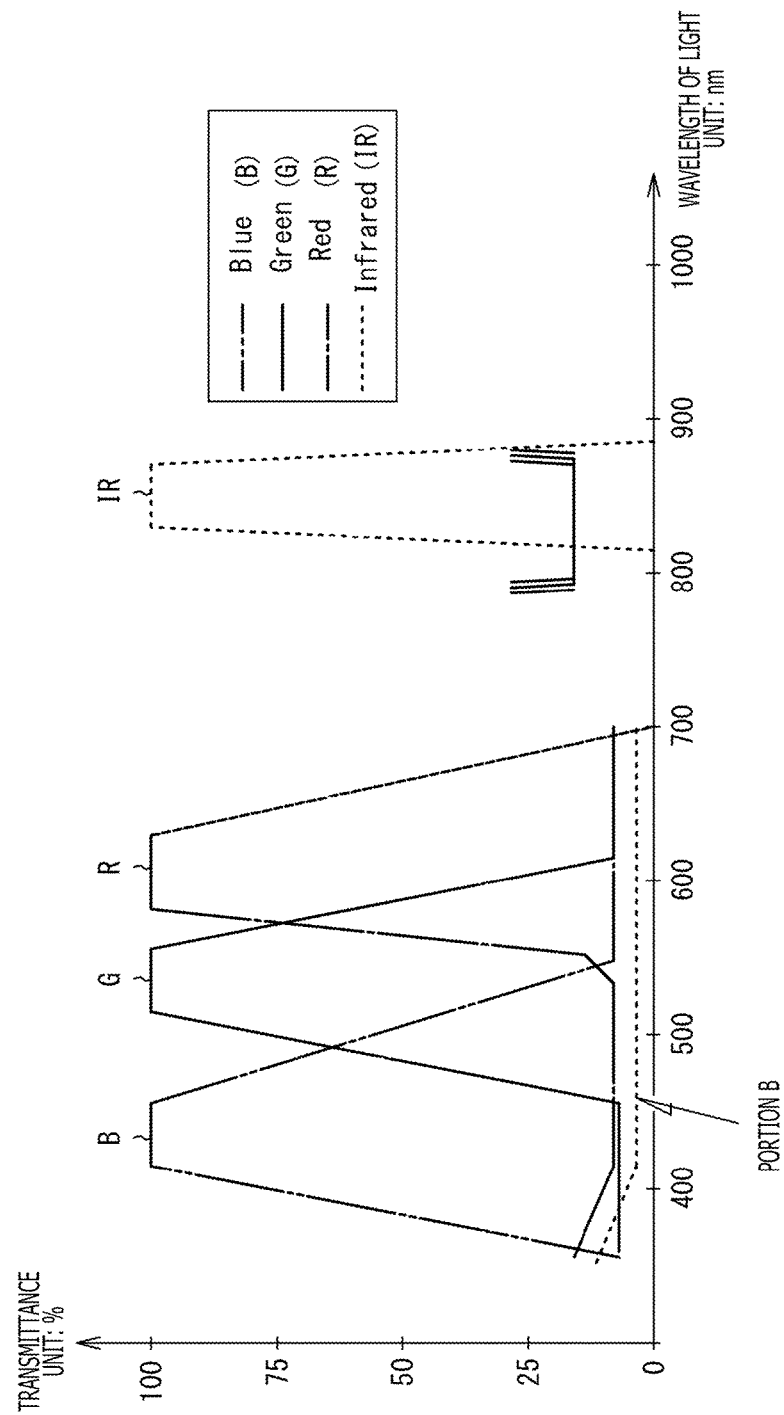
FIG. 16 is a schematic graph illustrating the overall spectral transmittance at the center of the imaging area of the imaging element in a case where the near-infrared absorption filters according to the first embodiment are used.

FIG. 16 is a schematic graph illustrating the overall spectral transmittance at the center of the imaging area of the imaging element in a case where the near-infrared absorption filters according to the first embodiment are used. Further, FIG. 17 is a schematic graph illustrating the overall spectral transmittance at the periphery of the imaging area of the imaging element in the case where the near-infrared absorption filters according to the first embodiment are used.

Figure 17:
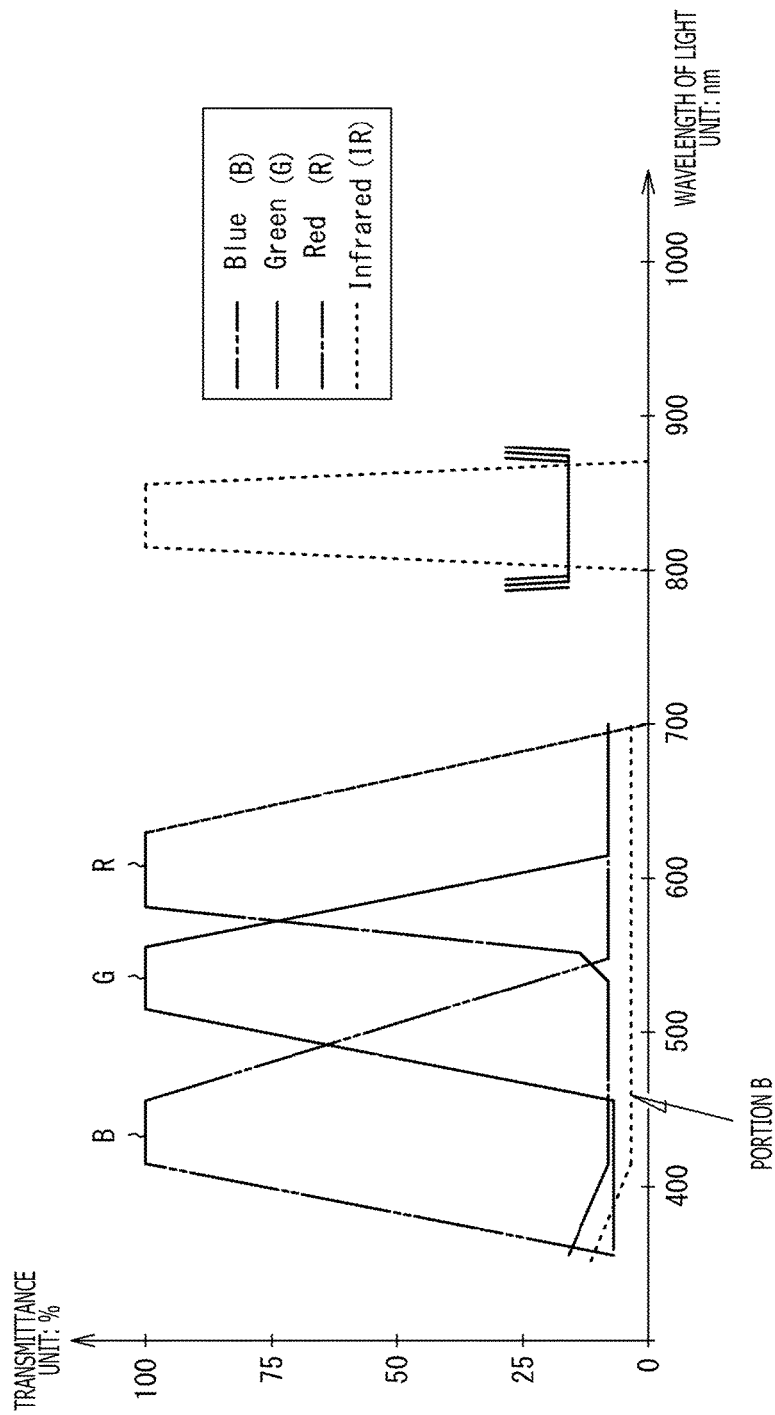
FIG. 17 is a schematic graph illustrating the overall spectral transmittance at a part of the imaging area of the imaging element where the CRA is 30 degrees in the case where the near-infrared absorption filters according to the first embodiment are used.

As is obvious from FIGS. 16 and 17, the mixed color component that is obtained when visible light is mixed with near-infrared light does not significantly change even when the CRA is increased to shift the near-infrared light transmission band of the dual-pass filter 70 toward the short wavelength side. Consequently, a color tone change caused by the difference in CRA is reduced. This makes it possible to improve screen uniformity.

The foregoing description assumes that the near-infrared absorption filters 50 include two layers. Alternatively, however, the near-infrared absorption filters 50 may include a single layer. More specifically, the near-infrared absorption filters 50 may be formed by a single layer having two different coloring substances that differ in near-infrared light absorption characteristics.

[Second Embodiment]

A second embodiment relates to a camera system according to the present disclosure.

The description given in conjunction with the first embodiment states that a color difference arises from the difference in CRA when matrix computation is performed as indicated in Equation (1) above in a case where the near-infrared absorption filters cited as the reference example are used.

In the second embodiment, the signal processing section performs computation by changing a matrix coefficient in accordance with the positions of the photoelectric conversion sections. The matrix coefficient is used to perform computation for eliminating the influence of near-infrared light included in signals from the visible light photoelectric conversion section. Consequently, a color difference arising from the difference in CRA is reduced.

A schematic configuration diagram of the camera system 2 according to the second embodiment is obtained from FIG. 1 by reading the signal processing section 300 as the signal processing section 300B and reading the camera system 1 as the camera system 1B while the near-infrared absorption filters 50 have a configuration similar to that of the near-infrared absorption filters cited as the reference example, which has been described with reference to FIG. 6.

The description given in conjunction with the first embodiment states that the overall spectral transmittance at the center of the imaging area of the imaging element in the case where the near-infrared absorption filters cited as the reference example are used is as depicted in FIG. 9, and that the overall spectral transmittance at a part of the imaging area of the imaging element where the CRA is 30 degrees is as depicted in FIG. 10.

In the second embodiment, the coefficient for matrix computation varies with the CRA in order to cope with spectral transmittance changes resulting from CRA changes.

For example, in a case where the spectral transmittance is as depicted in FIG. 9, matrix computation is performed as indicated in Equation (1) above, as is the case with the first embodiment. Meanwhile, in a case where the spectral transmittance is as depicted in FIG. 10, the coefficient value is changed in accordance with the CRA, and matrix computation is performed as indicated in Equation (2) below in order to obtain the corrected red light signal $R_{cvt}$, the corrected green light signal $G_{cvt}$, the corrected blue light signal $B_{cvt}$, and the corrected near-infrared light signal $IR_{cvt}$.

$$\begin{bmatrix} R_{cvt} \\ G_{cvt} \\ B_{cvt} \\ IR_{cvt} \end{bmatrix} = \begin{bmatrix} 1.02 & 0 & 0 & -0.35 \\ 0.02 & 1.01 & 0 & -0.35 \\ 0.03 & 0.01 & 1.00 & -0.35 \\ -0.12 & 0 & -0.05 & 1.02 \end{bmatrix} \begin{bmatrix} R_{ori} \\ G_{ori} \\ B_{ori} \\ IR_{ori} \end{bmatrix} \quad (2)$$

The result of simulation indicates that the ΔEab difference in a 24-color Macbeth chart between a CRA of 0 degrees and a CRA of 30 degrees is 11.6 at maximum in patch No. 15 and 1.4 on the average of 24 colors. A ΔEab difference of 1.4 represents a sufficiently low level at which the color difference is too small to be recognized by the human eye.

It should be noted that the CRA varies with the position of the photoelectric conversion section 40 in the imaging element 100, for example, with the height of an image. In reality, therefore, the following configuration should be used to provide control.

Control should be exercised so as to predetermine optimum matrix coefficients based on a CRA value in accordance with the overall spectral transmittance based on the CRA value and store the predetermined optimum matrix coefficients in the form of a table. Then, the signal processing section 300B should perform signal processing after selecting an optimum matrix coefficient on the basis of an image height value corresponding to the photoelectric conversion sections 40 in accordance with the relation between the CRA and the image height value of each photoelectric conversion section, which is determined by the lens specifications for the optical section 200 and the specifications for the imaging element 100.

[Third Embodiment]

A third embodiment relates to an imaging element according to the present disclosure and to a camera system that uses such an imaging element.

The first embodiment is configured so that the near-infrared absorption filters 50 are selectively disposed on the light incident surfaces of the photoelectric conversion sections in correspondence with the visible light photoelectric conversion section, and that the near-infrared light absorption band provided by the near-infrared absorption filters 50 includes the near-infrared light transmission band of the dual-pass filter and extends toward the short wavelength side.

Meanwhile, the third embodiment is configured so as to reduce the angular dependence of the dual-pass filter itself.

A schematic configuration diagram of the camera system 1C according to the third embodiment is obtained from FIG. 1 by reading the dual-pass filter 70 as the optical filter 70C including the dual-pass filter, reading the imaging element 100 as the imaging element 100C, and reading the camera system 1 as the camera system 1C while the near-infrared absorption filters 50 have a configuration similar to that of the near-infrared absorption filters cited as the reference example, which has been described with reference to FIG. 6.

The imaging element 100C in the third embodiment includes a near-infrared absorption layer that is disposed integrally with or separately from the dual-pass filter. The near-infrared light transmission band of the dual-pass filter is sandwiched between first and second absorption bands for near-infrared light of the near-infrared absorption layer.

More specifically, the optical filter 70C used in the third embodiment includes the dual-pass filter having transmission bands for visible light and a predetermined range of near-infrared light, and the near-infrared absorption layer disposed integrally with or separately from the dual-pass filter. The near-infrared light transmission band of the dual-pass filter is sandwiched between the first and second absorption bands for near-infrared light of the near-infrared absorption layer. The near-infrared absorption layer includes at least two different coloring substances that differ in near-infrared light absorption characteristics.

Figure 18:
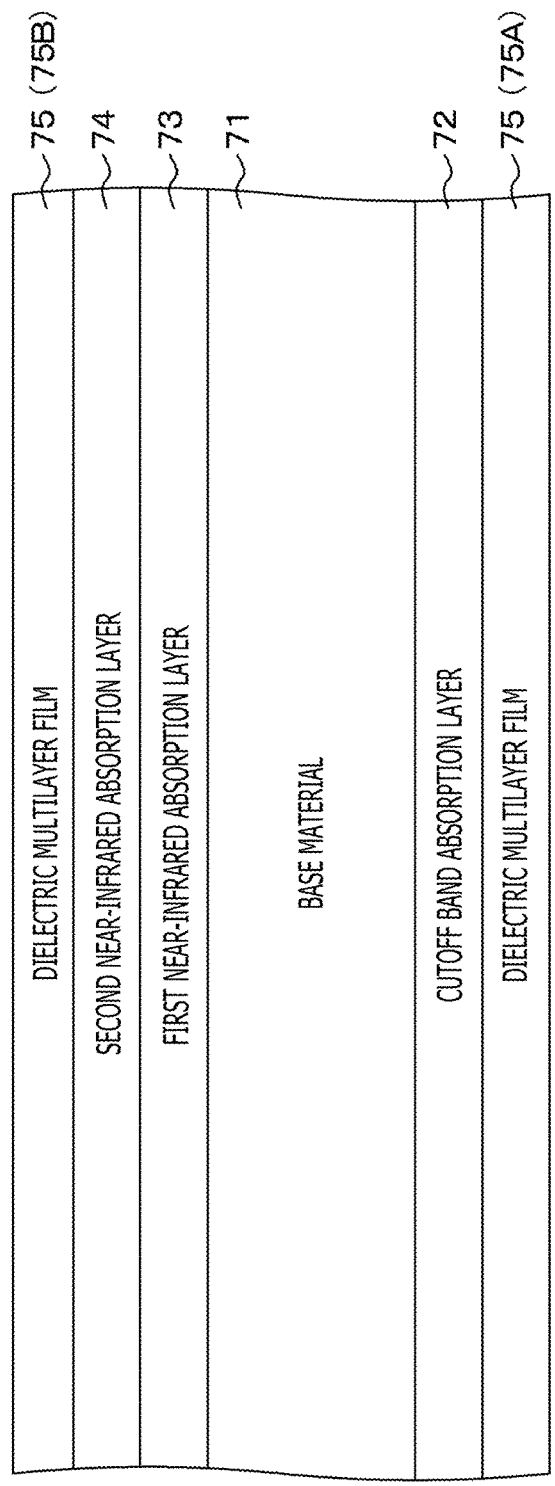
FIG. 18 is a schematic cross-sectional view illustrating a configuration of an optical filter that includes the dual-pass filter and is used in a third embodiment.

FIG. 18 is a schematic cross-sectional view illustrating a configuration of the optical filter that includes the dual-pass filter and is used in the third embodiment. In the example of FIG. 18, the near-infrared absorption layer includes a first near-infrared absorption layer 73 and a second near-infrared absorption layer 74. The first near-infrared absorption layer 73 includes one of two different coloring substances, and the second near-infrared absorption layer 74 includes the remaining one of the two different coloring substances.

The optical filter 70C including the dual-pass filter includes a base material 71 including, for example, glass, the first infrared absorption layer 73, the second infrared absorption layer 74, a cutoff band absorption layer 72, and dielectric multilayer films 75 (75A, 75B) that forms a spectrum having a wavelength region not apparently exhibited even in the case of shifting toward the short wavelength side. The cutoff band is typically a band having a wavelength of 650 to 750 nm. In the example of the drawing, the dielectric multilayer films are disposed on both surfaces of the substrate from the viewpoint of reducing the warp of the base material 71. It should be noted that the dielectric multilayer films 75 may have anti-reflective characteristics in order to reduce surface reflection. Further, for example, the base material 71 may include a transparent resin material with a cutoff band absorption coloring substance kneaded into the base material.

Figure 19:
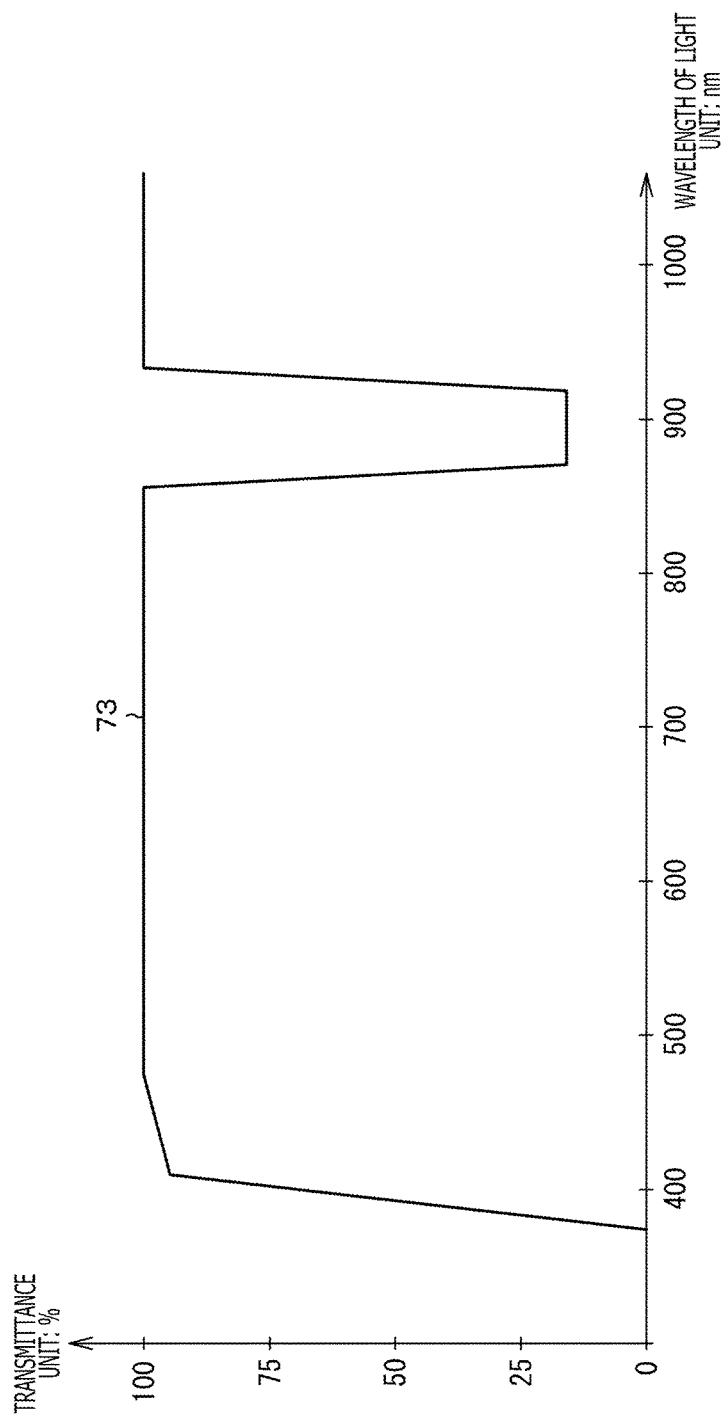
FIG. 19 is a schematic graph illustrating the spectral transmittance of a first infrared absorption layer included in the optical filter including the dual-pass filter.
Figure 20:
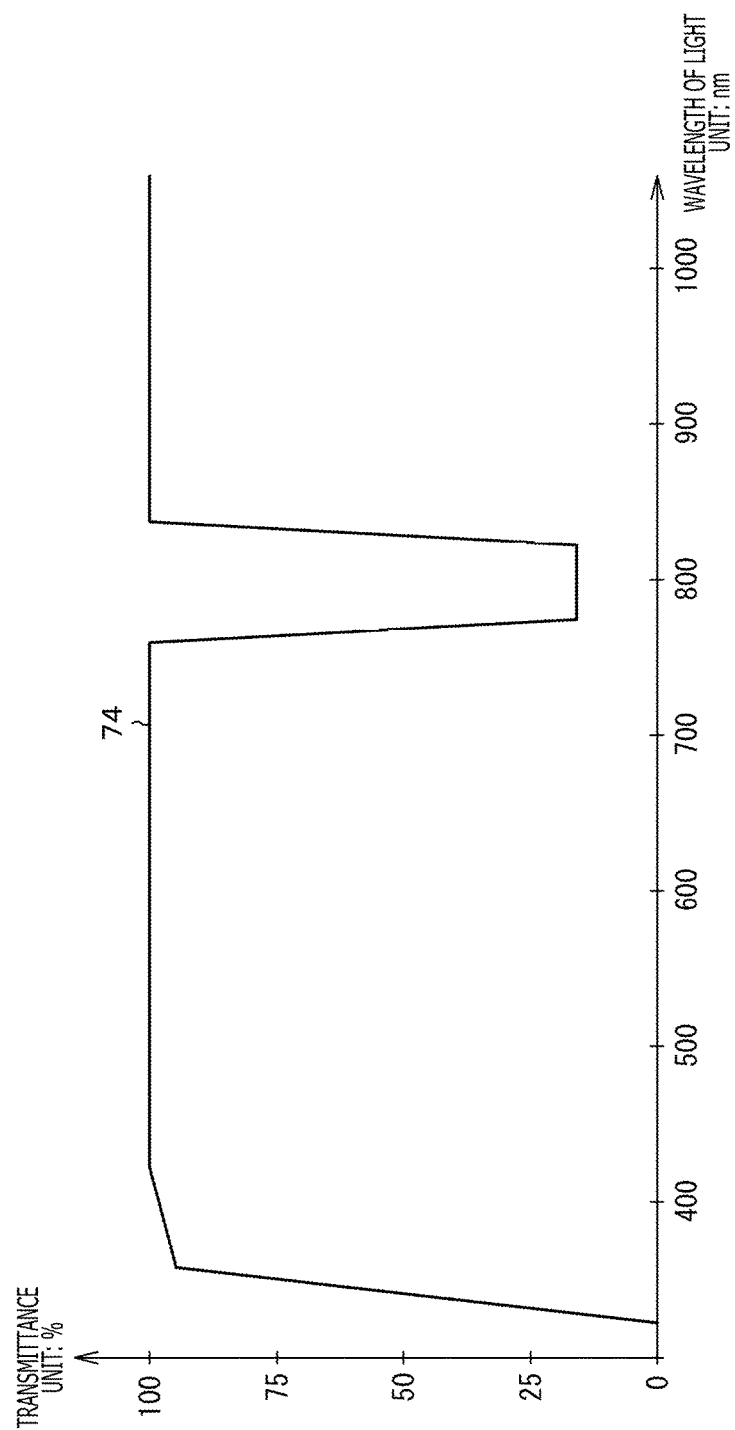
FIG. 20 is a schematic graph illustrating the spectral transmittance of a second infrared absorption layer included in the optical filter including the dual-pass filter.

FIG. 19 is a schematic graph illustrating the spectral transmittance of a first infrared absorption layer included in the optical filter including the dual-pass filter. The center of the near-infrared light absorption band is set, for example, to approximately 800 nm. FIG. 20 is a schematic graph illustrating the spectral transmittance of a second infrared absorption layer included in the optical filter including the dual-pass filter. The center of the near-infrared light absorption band is set, for example, to approximately 900 nm.

Figure 21:
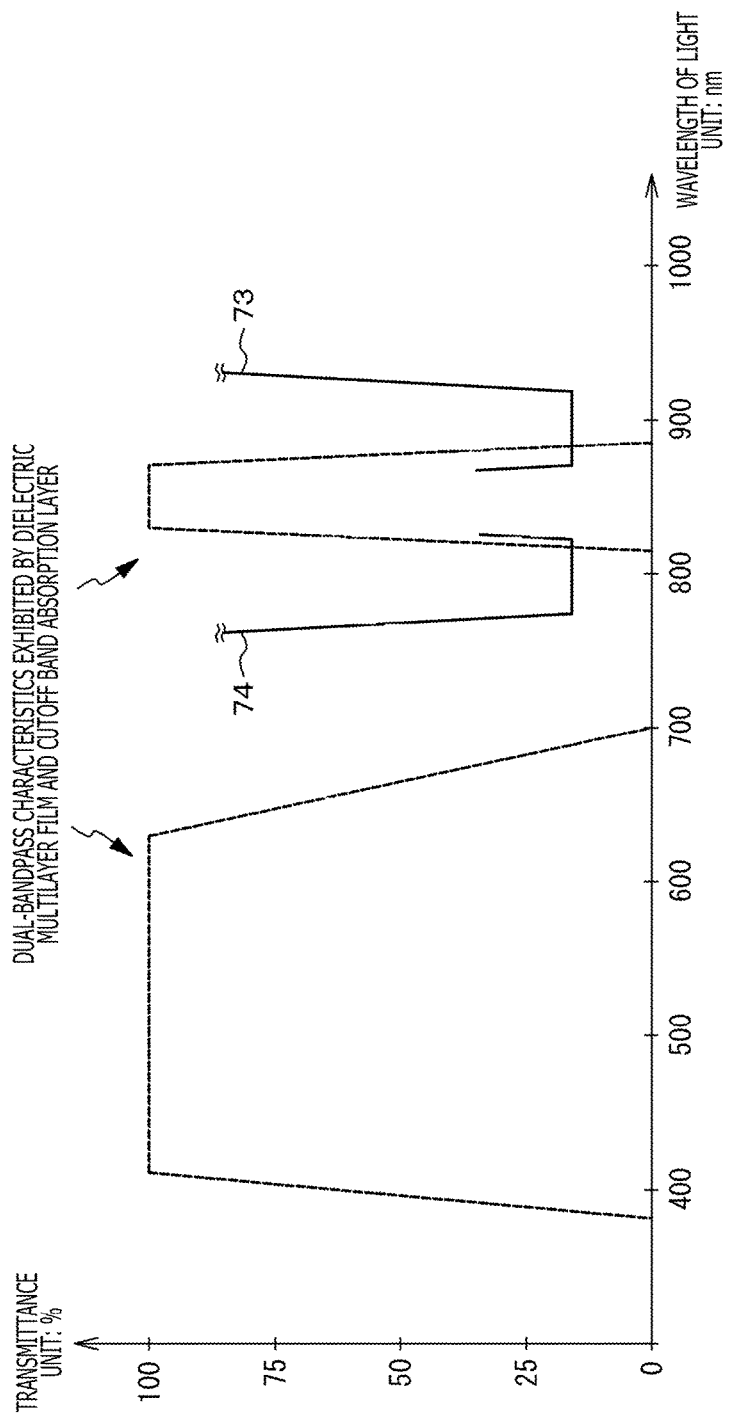
FIG. 21 is a schematic graph illustrating the spectral transmittance of the optical filter that includes the dual-pass filter and is used in the third embodiment.

FIG. 21 is a schematic graph illustrating the spectral transmittance of the optical filter that includes the dual-pass filter and is used in the third embodiment. Dual-pass characteristics exhibited by the cutoff band absorption layer and the dielectric multilayer films are substantially similar to those in the first embodiment.

As depicted in FIG. 21, the near-infrared light transmission band based on the dual-pass characteristics is sandwiched between the near-infrared light absorption band of the first infrared absorption layer (the first absorption band) and the near-infrared light absorption band of the second infrared absorption layer (the second absorption band). Therefore, even when the near-infrared light transmission band of the dielectric multilayer films is shifted toward the short wavelength side due to oblique incidence of light rays, the spectral characteristics rarely exhibit apparent changes due to the first and second infrared absorption layers, which are not dependent on angles, and the amount of near-infrared light entering the visible light photoelectric conversion section 40 does not significantly change. Consequently, a color tone change caused by the difference in CRA is reduced. This makes it possible to improve screen uniformity.

The optical filter 70C including the dual-pass filter in the third embodiment need not always have an integral configuration. Modifications of the third embodiment are described below.

Figure 22:
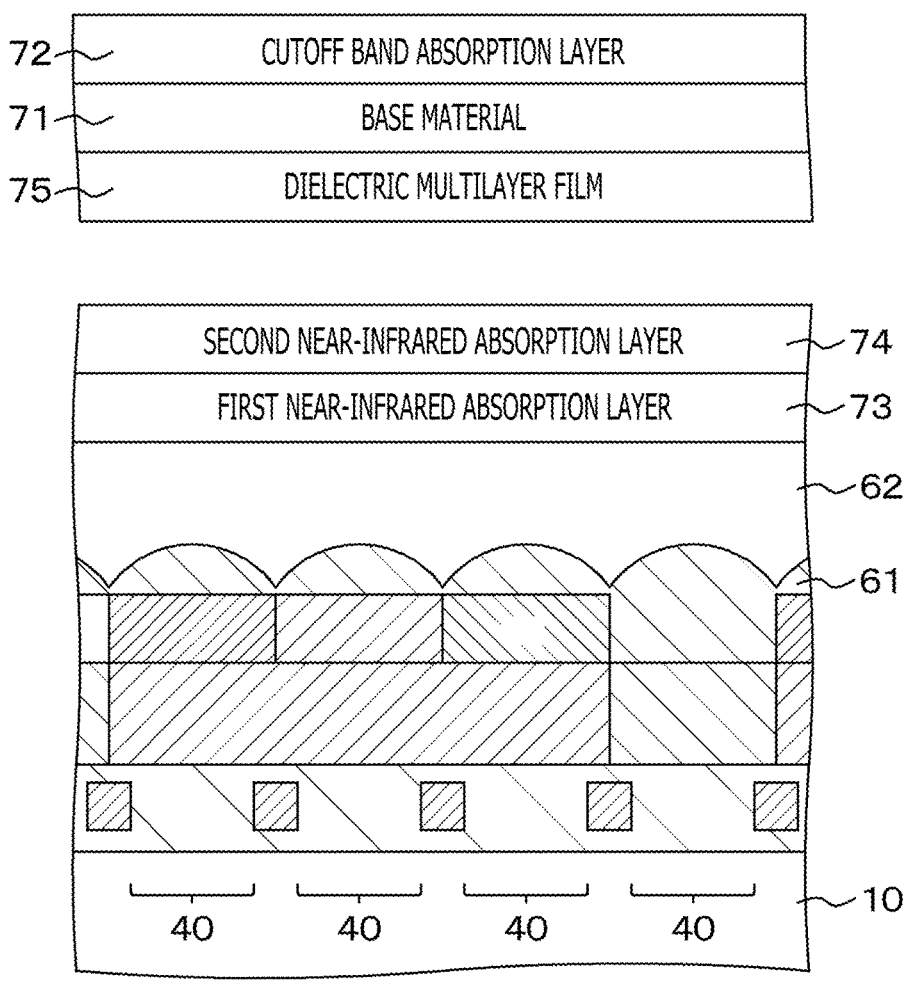
FIG. 22 is a schematic partial end view of the imaging element that is presented to illustrate a first modification of the third embodiment.
Figure 23:
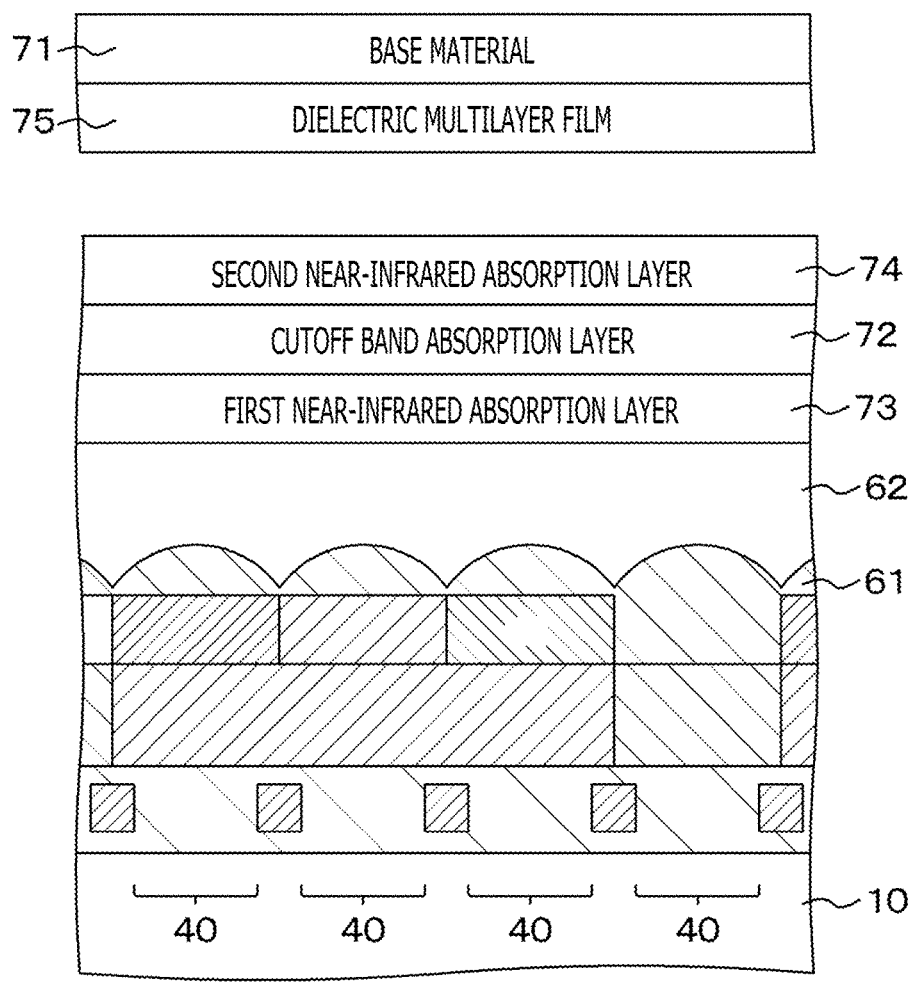
FIG. 23 is a schematic partial end view of the imaging element that is presented to illustrate a second modification of the third embodiment.
Figure 24:
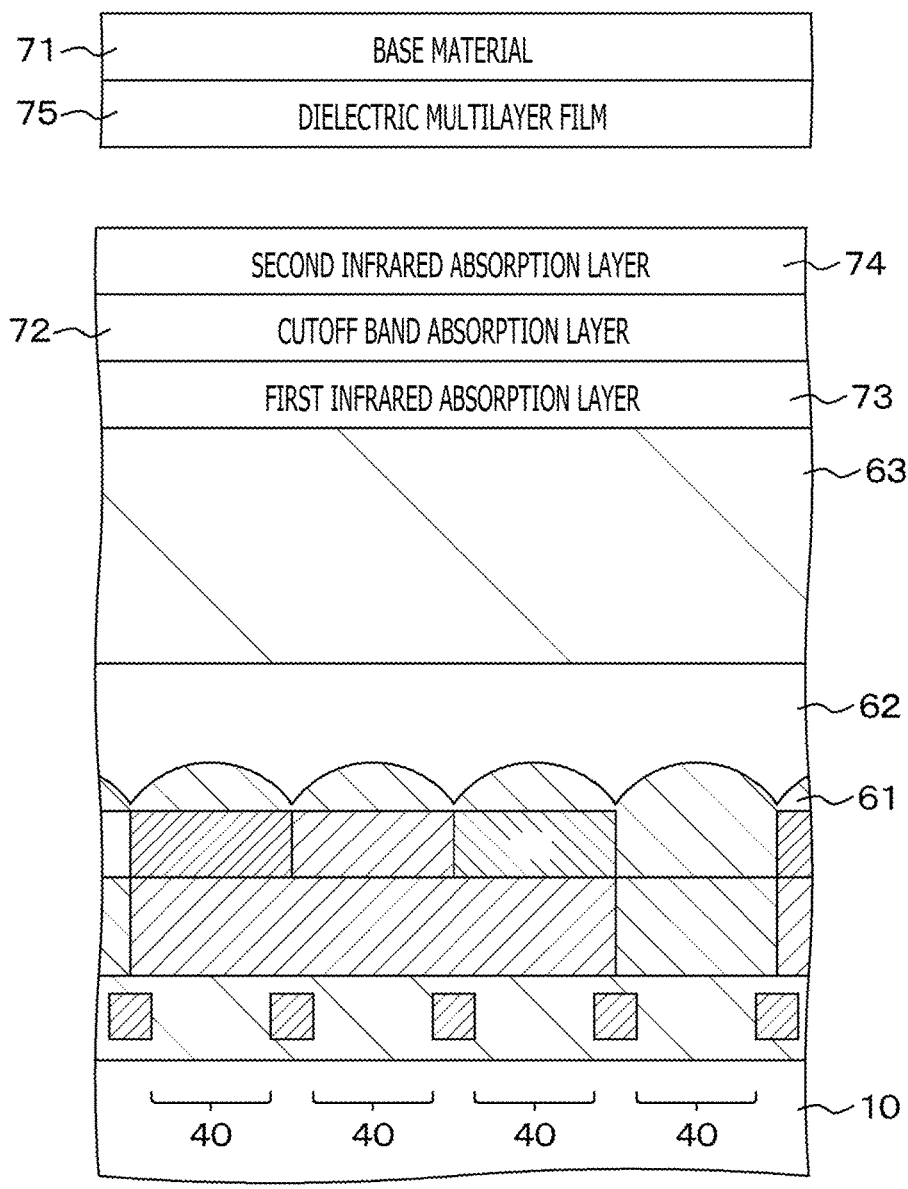
FIG. 24 is a schematic partial end view of the imaging element that is presented to illustrate a third modification of the third embodiment.

FIG. 22 is a schematic partial end view of the imaging element that is presented to illustrate a first modification of the third embodiment. FIG. 23 is a schematic partial end view of the imaging element that is presented to illustrate a second modification of the third embodiment. FIG. 24 is a schematic partial end view of the imaging element that is presented to illustrate a third modification of the third embodiment.

In the above-mentioned modifications, the upper surface of the on-chip lens of the imaging element is planarized by a low-refractive-index material. A coating film is formed over the upper surface of the low-refractive-index material or a coating film is formed over the upper surface of seal glass that is attached to the upper surface of the low-refractive-index material.

FIG. 22 depicts a configuration in which infrared absorption layers are formed over the planarized upper surface of the imaging element and a cutoff band absorption layer and a dielectric multilayer film, which are included in the dual-pass filter, are formed on the base material.

FIG. 23 depicts a configuration in which the dielectric multilayer film is formed on the base material although the dual-pass filter includes the cutoff band absorption layer and the dielectric multilayer film, and a different layer including the cutoff band absorption layer is formed over the planarized upper surface of the imaging element.

FIG. 24 depicts an example in which the dielectric multilayer film is formed on the base material although the dual-pass filter includes the cutoff band absorption layer and the dielectric multilayer film, and a different layer is formed over the upper surface of the seal glass attached to the imaging element. It should be noted that, although not depicted, all the layers may be formed over the upper surface of the seal glass.

Individual layers forming the optical filter 70C including the dual-pass filter should be disposed in an appropriate manner from the viewpoint of customizability based on production and use and from the viewpoint, for example, of process resistance of constituent materials.

The above description assumes that there are two near-infrared absorption layers. Alternatively, however, there may be only one near-infrared absorption layer. More specifically, there may be only one near-infrared absorption layer including two different coloring substances that differ in near-infrared light absorption characteristics.

[Fourth Embodiment]

A fourth embodiment also relates to an imaging element according to the present disclosure and to a camera system that uses such an imaging element.

The fourth embodiment is similar in configuration to the first embodiment except that the color filters and the near-infrared filters are disposed in a different manner. A schematic configuration diagram of the camera system 1D according to the fourth embodiment is obtained from FIG. 1 by reading the imaging element 100 as the imaging element 100D and reading the camera system 1 as the camera system 1D.

For ease of understanding, first of all, the arrangement, for example, of the color filters and near-infrared absorption filters in the first embodiment will be described.

FIG. 25 are schematic plan views illustrating the arrangement of the color filters and near-infrared absorption filters in the first embodiment. FIG. 25A is a schematic plan view illustrating the arrangement of the color filters in the first embodiment. FIG. 25B is a schematic plan view illustrating the arrangement of the near-infrared absorption filters in the first embodiment.

FIG. 25C is a schematic plan view illustrating the arrangement of the photoelectric conversion sections that are involved in the acquisition of a near-infrared image in the first embodiment.

The color filters 60 depicted in FIG. 25A are designated by the signs "R," "G," "B," and "IR," which respectively represent red, green, blue, and near-infrared light filters. This also holds true for the later-described other drawings. As depicted in FIG. 25A, on the basis of the Bayer arrangement in which one red pixel, two green pixels, and one blue pixel are formed into a group, the color filters 60 are arrayed by replacing one of a pair of green color filters with a near-infrared absorption filter.

As depicted in FIG. 25B, the near-infrared absorption filters 50 are disposed in correspondence with the visible light photoelectric conversion section 40. More specifically, the near-infrared absorption filters 50 are disposed in correspondence with the red, green, and blue color filters.

When the above configuration is adopted, the number of near-infrared light photoelectric conversion sections is ¼ the total number of photoelectric conversion sections. Depending on use, however, it is conceivable that the resolution of near-infrared images is insufficient. For example, in a case where the camera system is used for iris authentication, it is necessary to capture an image of an iris at a high resolution in order to increase the accuracy of authentication. The total number of pixels in the imaging element can be increased to raise the resolution of near-infrared images. However, an increase in the number of pixels enlarges the element size and raises the cost.

The inventors have found that the S/N ratio significantly deteriorates particularly in the corrected blue light signal when corrected signals are obtained, during the use of an imaging element having no near-infrared absorption filter in the visible light photoelectric conversion section, by performing computation in such a manner as to subtract the output of the near-infrared light photoelectric conversion section from the output of the visible light photoelectric conversion section. This is probably because, for example, the amount of a blue component of visible light is small by nature when common ambient light is used or S/N ratio deterioration caused by computation is significant when an image is captured under an illumination light or other near-infrared light rich environment.

In view of the above circumstances, the fourth embodiment is configured so that the near-infrared absorption filters 50 are selectively disposed for the blue light photoelectric conversion section in the visible light photoelectric conversion section 40.

Figure 26C:
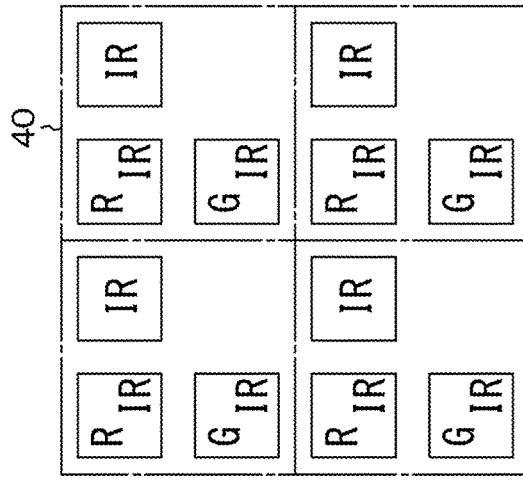
FIG. 26C is a schematic plan view illustrating the arrangement of the photoelectric conversion sections that are involved in the acquisition of a near-infrared image in the fourth embodiment.
Figure 26B:
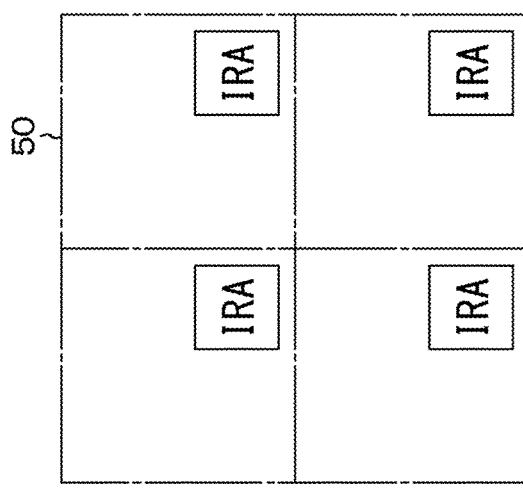
FIG. 26B is a schematic plan view illustrating the arrangement of the near-infrared absorption filters in the fourth embodiment.
Figure 26A:
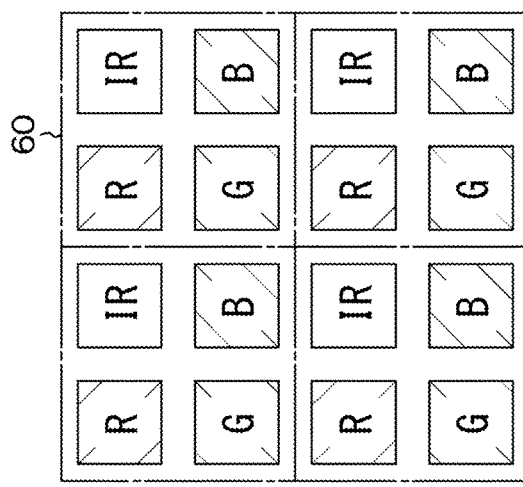
FIG. 26A is a schematic plan view illustrating the arrangement of the color filters in the fourth embodiment.

FIG. 26 are schematic plan views illustrating the arrangement of the color filters and near-infrared absorption filters in the fourth embodiment. FIG. 26A is a schematic plan view illustrating the arrangement of the color filters in the fourth embodiment. FIG. 26B is a schematic plan view illustrating the arrangement of the near-infrared absorption filters in the fourth embodiment. FIG. 26C is a schematic plan view illustrating the arrangement of the photoelectric conversion sections that are involved in the acquisition of a near-infrared image in the fourth embodiment.

As depicted in the drawings, the near-infrared absorption filters 50 are selectively disposed for the blue light photoelectric conversion section 40. This makes it possible to suppress S/N ratio deterioration caused by computation and achieve near-infrared image capture not only with the near-infrared light photoelectric conversion section but also with the red and green light photoelectric conversion sections. Consequently, the number of photoelectric conversion sections contributing to near-infrared light image capture is ¾ the total number of photoelectric conversion sections. As a result, the resolution of near-infrared images can be raised.

FIG. 27 is a schematic partial end view of the imaging element according to the fourth embodiment. For convenience of illustration, it is assumed that red, green, blue, and near-infrared light elements are arrayed in a row. The color filters 60 and the near-infrared absorption filters 50 are stacked over the light incident surface of the blue light photoelectric conversion section 40. It should be noted that a layer 50C including a transparent material is disposed on the light incident surfaces of the red and green light photoelectric conversion sections 40 in correspondence with an omitted near-infrared absorption filter 50.

It should be noted that, in the above-described configuration, matrix computation should be performed as indicated in Equation (3) below in order to obtain the corrected red light signal $R_{cvt}$, the corrected green light signal $G_{cvt}$, the corrected blue light signal $B_{cvt}$, and the corrected near-infrared light signal $IR_{cvt}$.

$$\begin{bmatrix} R_{cvt} \\ G_{cvt} \\ B_{cvt} \\ IR_{cvt} \end{bmatrix} = \begin{bmatrix} 1.02 & 0 & 0 & -1.00 \\ 0.02 & 1.01 & 0 & -1.00 \\ 0.03 & 0.01 & 1.00 & -0.20 \\ -0.12 & 0 & -0.05 & 1.02 \end{bmatrix} \begin{bmatrix} R_{ori} \\ G_{ori} \\ B_{ori} \\ IR_{ori} \end{bmatrix} \quad (3)$$

It should be noted that a near-infrared image without components derived from visible light and near-infrared light among ambient light can be acquired by capturing an image while no light is emitted from the near-infrared light source section, capturing an image while light is emitted from the near-infrared light source section, and determining the difference between the captured images. It is preferable that a visible light image be captured while no light is emitted from the near-infrared light source section.

[Fifth Embodiment]

A fifth embodiment also relates to an imaging element according to the present disclosure and to a camera system that uses such an imaging element.

The fifth embodiment is similar in configuration to the first embodiment except that the color filters and the near-infrared absorption filters are disposed in a different manner. A schematic configuration diagram of the camera system 1E according to the fifth embodiment is obtained from FIG. 1 by reading the imaging element 100 as the imaging element 100E and reading the camera system 1 as the camera system 1E.

In the fifth embodiment, the green light photoelectric conversion section is set to a higher placement ratio than the other photoelectric conversion sections. FIG. 28 are schematic plan views illustrating the arrangement of the color filters and near-infrared absorption filters in the fifth embodiment. FIG. 28A is a schematic plan view illustrating the arrangement of the color filters in the fifth embodiment. FIG. 28B is a schematic plan view illustrating the arrangement of the near-infrared absorption filters in the fifth embodiment.

Figure 28C:
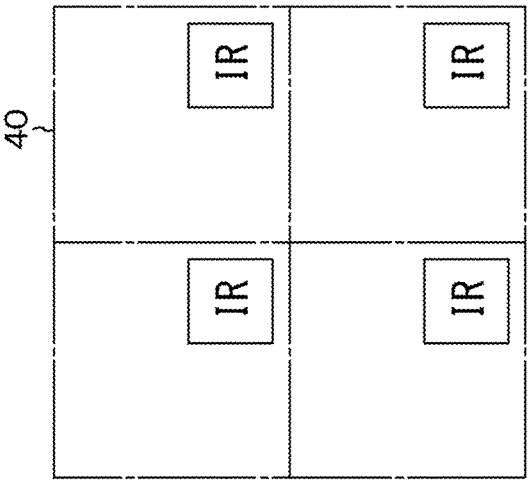
FIG. 28C is a schematic plan view illustrating the arrangement of the photoelectric conversion sections that are involved in the acquisition of a near-infrared image in the fifth embodiment.
Figure 28B:
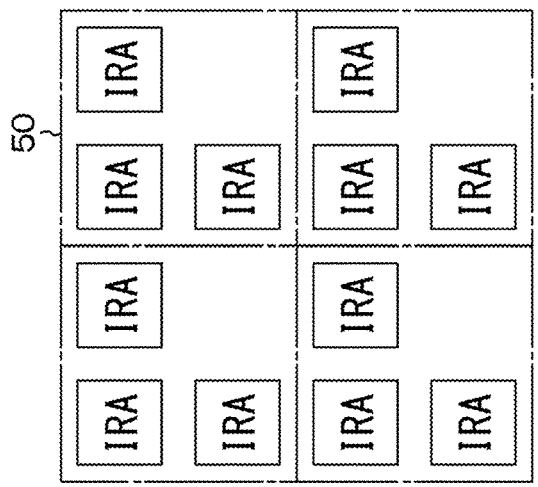
FIG. 28B is a schematic plan view illustrating the arrangement of the near-infrared absorption filters in the fifth embodiment.
Figure 28A:
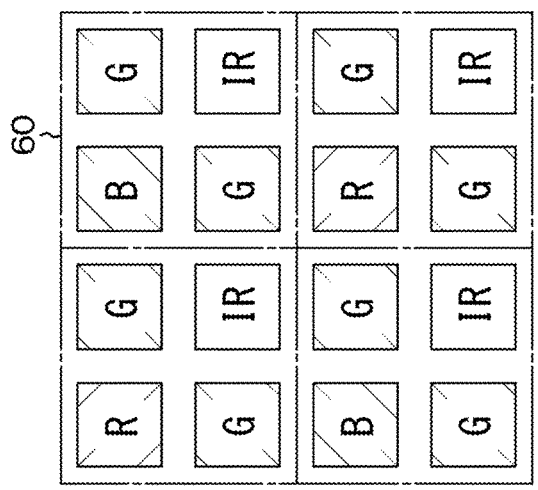
FIG. 28A is a schematic plan view illustrating the arrangement of the color filters in the fifth embodiment.

FIG. 28C is a schematic plan view illustrating the arrangement of the photoelectric conversion sections that are involved in the acquisition of a near-infrared image in the fifth embodiment.

When the above-mentioned arrangement scheme is adopted, the number of green light photoelectric conversion sections 40 acquiring luminance information is ½ the total number of photoelectric conversion sections. As a result, the resolution of visible light images can be equivalent to the resolution achieved by the common Bayer arrangement. The cross-sectional structure is similar to the one indicated in FIG. 12.

It should be noted that the near-infrared absorption filters 50 may be disposed only on the light incident surface of the blue light photoelectric conversion section 40, as is the case with the fourth embodiment. FIG. 29 are diagrams illustrating the arrangement of the color filters and near-infrared absorption filters in the fifth embodiment in a case where the arrangement of the near-infrared absorption filters is limited. FIG. 29A is a schematic plan view illustrating the arrangement of the color filters. FIG. 29B is a schematic plan view illustrating the arrangement of the near-infrared absorption filters. FIG. 29C is a schematic plan view illustrating the arrangement of the photoelectric conversion sections that are involved in the acquisition of a near-infrared image.

[Sixth Embodiment]

A sixth embodiment also relates to an imaging element according to the present disclosure and to a camera system that uses such an imaging element.

The sixth embodiment is similar in configuration to the first embodiment except that a near-infrared image is captured by using a white light photoelectric conversion section. A schematic configuration diagram of the camera system 1F according to the sixth embodiment is obtained from FIG. 1 by reading the imaging element 100 as the imaging element 100F and reading the camera system 1 as the camera system 1F.

In the sixth embodiment, the near-infrared light photoelectric conversion section includes the white light photoelectric conversion section. FIG. 30 are schematic plan views illustrating the arrangement of the color filters and near-infrared absorption filters in the sixth embodiment. FIG. 30A is a schematic plan view illustrating the arrangement of the color filters in the sixth embodiment. FIG. 30B is a schematic plan view illustrating the arrangement of the near-infrared absorption filters in the sixth embodiment. FIG. 30C is a schematic plan view illustrating the arrangement of the photoelectric conversion sections that are involved in the acquisition of a near-infrared image in the sixth embodiment.

The color filters 60 that are depicted in FIG. 30A and designated by the sign "W" include, for example, a material that transmits visible light and near-infrared light. The white light photoelectric conversion section 40 is sensitive not only to visible light but also to near-infrared light. Therefore, a near-infrared imaging signal can be obtained by subtracting the outputs of the red, green, and blue light photoelectric conversion sections from the output of the white light photoelectric conversion section.

Figure 31C:
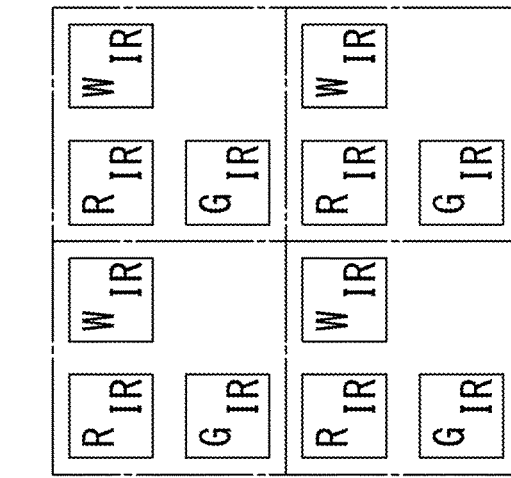
FIG. 31C is a schematic plan view illustrating the arrangement of the photoelectric conversion sections that are involved in the acquisition of a near-infrared image.
Figure 31B:
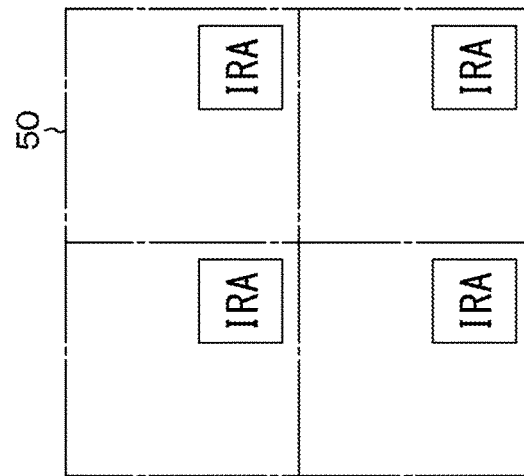
FIG. 31B is a schematic plan view illustrating the arrangement of the near-infrared absorption filters.
Figure 31A:
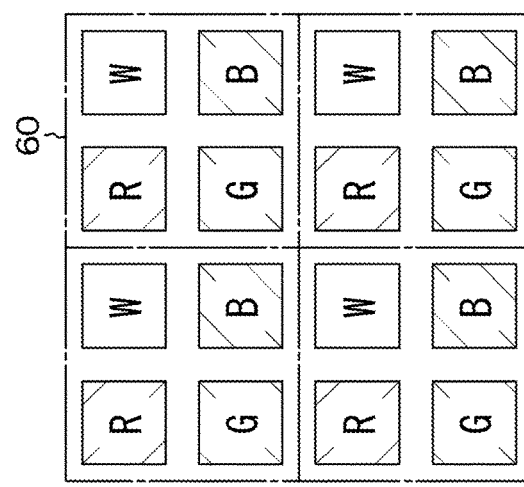
FIG. 31A is a schematic plan view illustrating the arrangement of the color filters.

It should be noted that the near-infrared absorption filters 50 may be disposed only on the light incident surface of the blue light photoelectric conversion section 40, as is the case with the fourth embodiment. FIG. 31 are diagrams illustrating the arrangement of the color filters and near-infrared absorption filters in the sixth embodiment in a case where the arrangement of the near-infrared absorption filters is limited. FIG. 31A is a schematic plan view illustrating the arrangement of the color filters. FIG. 31B is a schematic plan view illustrating the arrangement of the near-infrared absorption filters. FIG. 31C is a schematic plan view illustrating the arrangement of the photoelectric conversion sections that are involved in the acquisition of a near-infrared image.

[Seventh Embodiment]

A seventh embodiment relates to a modification of the cross-sectional structure of the imaging element.

Figure 32:
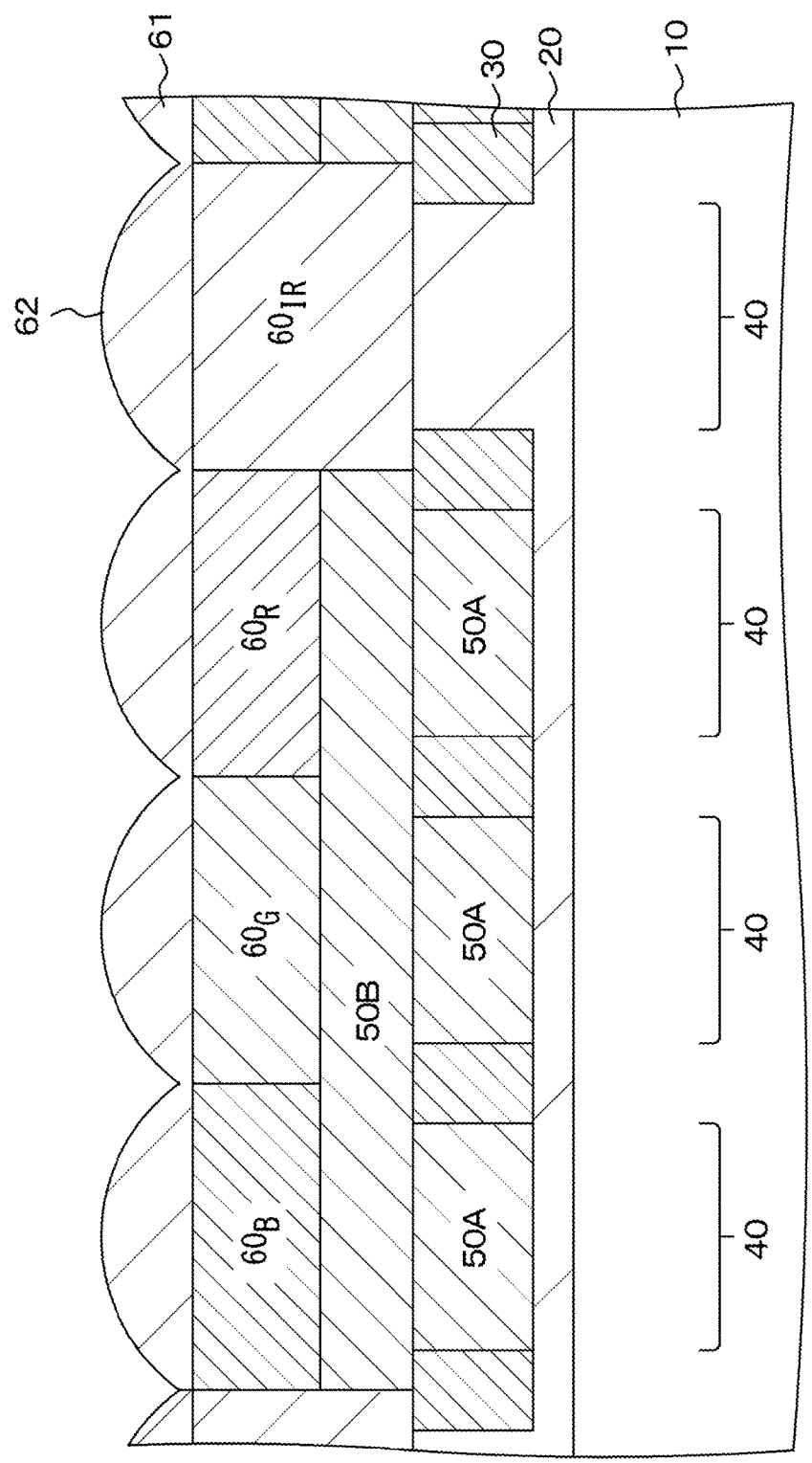
FIG. 32 is a schematic partial end view of the imaging element in a seventh embodiment.

FIG. 32 is a schematic partial end view of the imaging element in the seventh embodiment.

The cross-sectional structure depicted in FIG. 12, which is referenced in conjunction with the first embodiment, indicates that the near-infrared absorption filters 50 are stacked over a planarized film. This may increase the thickness of the imaging element. Accordingly, the seventh embodiment is configured so that the near-infrared absorption filters 50 are partly embedded in the planarized film.

At least a part of the near-infrared absorption filters 50 (or more specifically, the first near-infrared absorption layer 50A) is embedded into the opening in the light-shielding layer 30 that separates neighboring photoelectric conversion sections 40. More specifically, after the planarized film is formed, the near-infrared absorption filters should be embedded into the opening that is formed in the planarized film by using a well-known patterning technique.

[Eighth Embodiment]

An eighth embodiment relates to a modification of the cross-sectional structure of the imaging element.

Figure 33:
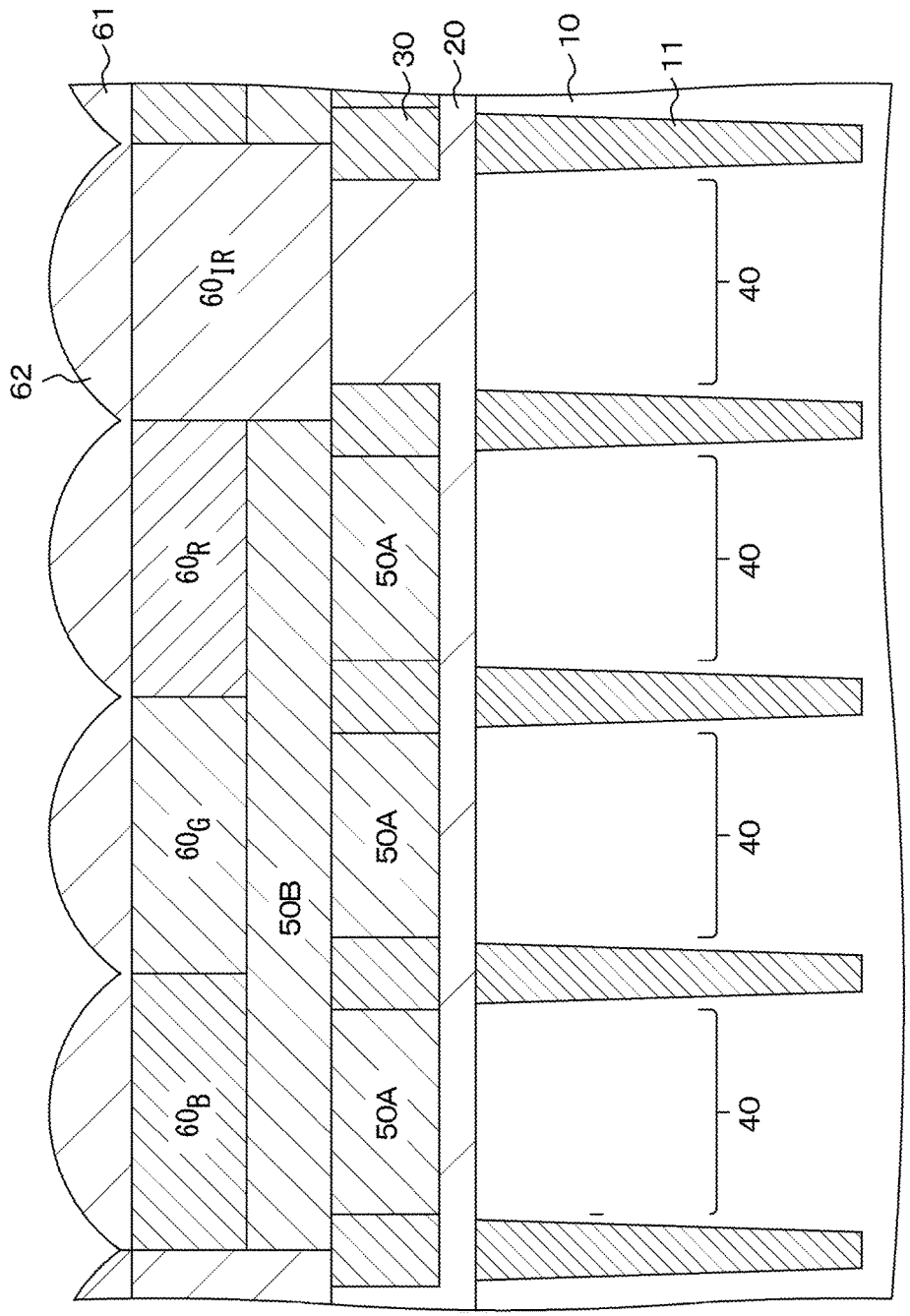
FIG. 33 is a schematic partial end view of the imaging element in an eighth embodiment.

FIG. 33 is a schematic partial end view of the imaging element in the eighth embodiment.

In order to prevent color mixture, a shallow trench structure 11 is formed on the substrate on which the photoelectric conversion sections 40 are mounted. The shallow trench structure 11 separates the neighboring photoelectric conversion sections 40. The shallow trench structure 11 is formed by making a groove in the substrate 10 by using, for example, the RIE technology, and embedding a metal or dielectric material into the groove. This reduces the color mixture in the substrate that is caused by oblique incident light rays.

While embodiments of the present disclosure have been described in detail, it should be understood that the present disclosure is not limited to the foregoing embodiments, and that various modifications can be made on the basis of the technical idea of the present disclosure. For example, the numerical values, structures, substrates, raw materials, and processes mentioned in conjunction with the foregoing embodiments are merely illustrative and not restrictive. For example, other numerical values, structures, substrates, raw materials, and processes may be used as needed.

It should be noted that the technology provided by the present disclosure may adopt the following configurations.

[A1]

An imaging element including:

a plurality of photoelectric conversion sections that are arrayed on a substrate to receive light incident through a dual-pass filter having transmission bands for visible light and a predetermined range of near-infrared light, in which the photoelectric conversion sections include a visible light photoelectric conversion section and a near-infrared light photoelectric conversion section, and the visible light photoelectric conversion section includes a red light photoelectric conversion section, a green light photoelectric conversion section, and a blue light photoelectric conversion section.

[A2]

The imaging element as described in [A1] above, in which the red light photoelectric conversion section, the green light photoelectric conversion section, the blue light photoelectric conversion section, and the near-infrared light photoelectric conversion section are arrayed in a mosaic pattern.

[A3]

The imaging element as described in [A1] or [A2] above, in which the green light photoelectric conversion section is set to a higher placement ratio than the other photoelectric conversion sections.

[A4]

The imaging element as described in any one of [A1] to [A3] above, in which the near-infrared light photoelectric conversion section includes a white light photoelectric conversion section.

[A5]

The imaging element as described in any one of [A1] to [A4] above, in which a shallow trench structure for separating neighboring photoelectric conversion sections is formed on the substrate.

[A6]

The imaging element as described in any one of [A1] to [A5] above, in which a near-infrared absorption filter is selectively disposed on a light incident surface of the photoelectric conversion sections in correspondence with the visible light photoelectric conversion section, and setup is performed so that a near-infrared light absorption band provided by the near-infrared absorption filter includes a near-infrared light transmission band of the dual-pass filter and extends toward a short wavelength side.

[A7]

The imaging element as described in [A6] above, in which the near-infrared light absorption band provided by the near-infrared absorption filter is set to include the near-infrared light transmission band of the dual-pass filter even in a case where the near-infrared light transmission band is shifted toward the short wavelength side due to oblique light incidence.

[A8]

The imaging element as described in [A7] above, in which the near-infrared absorption filter includes at least two different coloring substances differing in near-infrared light absorption characteristics.

[A9]

The imaging element as described in [A8] above, in which the near-infrared absorption filter includes a first near-infrared absorption layer and a second near-infrared absorption layer, and the first near-infrared absorption layer includes one of the two different coloring substances, and the second near-infrared absorption layer includes the remaining one of the two different coloring substances.

[A10]

The imaging element as described in [A8] above, in which the near-infrared absorption filter includes a single layer.

[A11]

The imaging element as described in any one of [A6] to [A10] above, in which the near-infrared absorption filter is selectively disposed in correspondence with the red light photoelectric conversion section, the green light photoelectric conversion section, and the blue light photoelectric conversion section.

[A12]

The imaging element as described in any one of [A6] to [A10] above, in which the near-infrared absorption filter is selectively disposed for the blue light photoelectric conversion section in the visible light photoelectric conversion section.

[A13]

The imaging element as described in any one of [A6] to [A12] above, in which a color filter and the near-infrared absorption filter are stacked over the light incident surface of the visible light photoelectric conversion section.

[A14]

The imaging element as described in [A13] above, in which at least a part of the near-infrared absorption filter is embedded into an opening in a light-shielding layer separating neighboring photoelectric conversion sections.

[A15]

The imaging element as described in any one of [A1] to [A5] above, further including:

a near-infrared absorption layer that is disposed integrally with or separately from the dual-pass filter, in which the near-infrared light transmission band of the dual-pass filter is sandwiched between a first absorption band and a second absorption band, the first absorption band and the second absorption band being provided for near-infrared light in the near-infrared absorption layer.

[A16]

The imaging element as described in [A15] above, in which the near-infrared absorption layer includes at least two different coloring substances differing in near-infrared light absorption characteristics.

[A17]

The imaging element as described in [A16] above, in which the near-infrared absorption layer includes a first near-infrared absorption layer and a second near-infrared absorption layer, and the first near-infrared absorption layer includes one of two different coloring substances, and the second near-infrared absorption layer includes the remaining one of the two different coloring substances.

[A18]

The imaging element as described in [A16] above, in which the near-infrared absorption layer includes a single layer containing two different coloring substances differing in near-infrared light absorption characteristics.

[A19]

A camera system including:

an optical section that forms an image of a subject;

an imaging element that includes a plurality of photoelectric conversion sections, the photoelectric conversion sections being arrayed on a substrate to receive light incident through a dual-pass filter having transmission bands for visible light and a predetermined range of near-infrared light; and a signal processing section that processes signals from the photoelectric conversion sections, in which the photoelectric conversion sections include a visible light photoelectric conversion section and a near-infrared light photoelectric conversion section, and the signal processing section performs computation after changing a matrix coefficient in accordance with a position of a photoelectric conversion section, the matrix coefficient being used to perform computation for eliminating an influence of near-infrared light included in a signal from the visible light photoelectric conversion section.

Further, the technology provided by the present disclosure may adopt the following configurations.

[B1]

An imaging element including:

a plurality of photoelectric conversion sections that are arrayed on a substrate to receive light incident through a dual-pass filter having transmission bands for visible light and a predetermined range of near-infrared light, in which the photoelectric conversion sections include a visible light photoelectric conversion section and a near-infrared light photoelectric conversion section, and a near-infrared absorption filter is selectively disposed on a light incident surface of the photoelectric conversion sections in correspondence with the visible light photoelectric conversion section, and setup is performed so that a near-infrared light absorption band provided by the near-infrared absorption filter includes a near-infrared light transmission band of the dual-pass filter and extends toward a short wavelength side.

[B2]

The imaging element as described in [B1] above, in which the near-infrared light absorption band provided by the near-infrared absorption filter is set to include the near-infrared light transmission band of the dual-pass filter even in a case where the near-infrared light transmission band is shifted toward the short wavelength side due to oblique light incidence.

[B3]

The imaging element as described in [B2] above, in which the near-infrared absorption filter includes at least two different coloring substances differing in near-infrared light absorption characteristics.

[B4]

The imaging element as described in [B3] above, in which the near-infrared absorption filter includes a first near-infrared absorption layer and a second near-infrared absorption layer, and the first near-infrared absorption layer includes one of the two different coloring substances, and the second near-infrared absorption layer includes the remaining one of the two different coloring substances.

[B5]

The imaging element as described in [B3] above, in which the near-infrared absorption filter includes a single layer.

[B6]

The imaging element as described in any one of [B1] to [B5] above, in which the visible light photoelectric conversion section includes a red light photoelectric conversion section, a green light photoelectric conversion section, and a blue light photoelectric conversion section.

[B7]

The imaging element as described in [B6] above, in which the red light photoelectric conversion section, the green light photoelectric conversion section, the blue light photoelectric conversion section, and the near-infrared light photoelectric conversion section are arrayed in a mosaic pattern.

[B8]

The imaging element as described in [B6] or [B7] above, in which the near-infrared absorption filter is selectively disposed in correspondence with the red light photoelectric conversion section, the green light photoelectric conversion section, and the blue light photoelectric conversion section.

[B9]

The imaging element as described in [B6] or [B7] above, in which the near-infrared absorption filter is selectively disposed for the blue light photoelectric conversion section in the visible light photoelectric conversion section.

[B10]

The imaging element as described in any one of [B6] to [B9] above, in which the green light photoelectric conversion section is set to a higher placement ratio than the other photoelectric conversion sections.

[B11]

The imaging element as described in any one of [B1] to [B10] above, in which the near-infrared light photoelectric conversion section includes a white light photoelectric conversion section.

[B12]

The imaging element as described in any one of [B1] to [B11] above, in which a color filter and the near-infrared absorption filter are stacked over the light incident surface of the visible light photoelectric conversion section.

[B13]

The imaging element as described in [B12] above, in which at least a part of the near-infrared absorption filter is embedded into an opening in a light-shielding layer separating neighboring photoelectric conversion sections.

[B14]

The imaging element as described in any one of [B1] to [B13] above, in which a shallow trench structure for separating neighboring photoelectric conversion sections is formed on the substrate.

[B15]

An imaging element including:

a dual-pass filter having transmission bands for visible light and a predetermined range of near-infrared light;

a near-infrared absorption layer disposed integrally with or separately from the dual-pass filter; and a plurality of photoelectric conversion sections arrayed on a substrate to receive light incident through the dual-pass filter, in which the photoelectric conversion sections include a visible light photoelectric conversion section and a near-infrared light photoelectric conversion section, and the near-infrared light transmission band of the dual-pass filter is sandwiched between a first absorption band and a second absorption band, the first absorption band and the second absorption band being provided for near-infrared light in the near-infrared absorption layer.

[B16]

The imaging element as described in [B15] above, in which the near-infrared absorption layer includes at least two different coloring substances differing in near-infrared light absorption characteristics.

[B17]

The imaging element as described in [B16] above, in which the near-infrared absorption layer includes a first near-infrared absorption layer and a second near-infrared absorption layer, and the first near-infrared absorption layer includes one of two different coloring substances, and the second near-infrared absorption layer includes the remaining one of the two different coloring substances.

[B18]

The imaging element as described in [B16] above, in which the near-infrared absorption layer includes a single layer containing two different coloring substances differing in near-infrared light absorption characteristics.

[B19]

An optical filter including:

a dual-pass filter having transmission bands for visible light and a predetermined range of near-infrared light; and a near-infrared absorption layer disposed integrally with or separately from the dual-pass filter, in which the near-infrared light transmission band of the dual-pass filter is sandwiched between a first absorption band and a second absorption band, the first absorption band and the second absorption band being provided for near-infrared light in the near-infrared absorption layer.

[B20]

A camera system including:

an optical section that forms an image of a subject;

an imaging element that includes a plurality of photoelectric conversion sections, the photoelectric conversion sections being arrayed on a substrate to receive light incident through a dual-pass filter having transmission bands for visible light and a predetermined range of near-infrared light; and a signal processing section that processes signals from the photoelectric conversion sections, in which the photoelectric conversion sections include a visible light photoelectric conversion section and a near-infrared light photoelectric conversion section, and the signal processing section performs computation after changing a matrix coefficient in accordance with a position of a photoelectric conversion section, the matrix coefficient being used to perform computation for eliminating an influence of near-infrared light included in a signal from the visible light photoelectric conversion section.

REFERENCE SIGNS LIST

1 . . . Camera system, 10 . . . Semiconductor substrate, 11 . . . Shallow trench structure, 20 . . . Planarization layer, 30 . . . Light-shielding layer, 40 . . . Photoelectric conversion section, 50 . . . Near-infrared absorption filter, 50A . . . First near-infrared absorption layer, 50B . . . Second near-infrared absorption layer, 50C . . . Transparent material layer, 60, $60_R$, $60_G$, $60_B$, $60_{IR}$ . . . Color filter, 61 . . . Transparent material layer, 62 . . . On-chip lens, 70 . . . Dual-pass filter, 70C . . . Optical filter including dual-pass filter, 71 . . . Base material, 72 . . . Cutoff band absorption layer, 73 . . . First near-infrared absorption layer, 74 . . . Second near-infrared absorption layer, 75, $75_A$, $75_B$ . . . Dielectric multilayer film, 100 . . . Imaging element, 200 . . . Optical section, 300 . . . Signal processing section, 400 . . . Near-infrared light source section

What is claimed is:

1. An imaging element comprising:
    a plurality of photoelectric conversion sections that are arrayed on a substrate to receive light incident through a dual-pass filter having transmission bands for visible light and a predetermined range of near-infrared light,
    wherein the photoelectric conversion sections include a visible light photoelectric conversion section and a near-infrared light photoelectric conversion section, and the visible light photoelectric conversion section includes a red light photoelectric conversion section, a green light photoelectric conversion section, and a blue light photoelectric conversion section,
    wherein a near-infrared absorption filter is selectively disposed on a light incident surface of the photoelectric conversion sections in correspondence with the visible light photoelectric conversion section, and
    wherein at least a part of the near-infrared absorption filter is embedded into an opening in a light-shielding layer separating neighboring photoelectric conversion sections.

2. The imaging element according to claim 1, wherein the red light photoelectric conversion section, the green light photoelectric conversion section, the blue light photoelectric conversion section, and the near-infrared light photoelectric conversion section are arrayed in a mosaic pattern.

3. The imaging element according to claim 1, wherein the green light photoelectric conversion section is set to a higher placement ratio than the other photoelectric conversion sections.

4. The imaging element according to claim 1, wherein the near-infrared light photoelectric conversion section includes a white light photoelectric conversion section.

5. The imaging element according to claim 1, wherein shallow trench structure for separating neighboring photoelectric conversion sections is formed on the substrate.

6. The imaging element according to claim 1, wherein a near-infrared light absorption band provided by the near-infrared absorption filter is set to include the near-infrared light transmission band of the dual-pass filter even in a case where the near-infrared light transmission band is shifted toward a short wavelength side due to oblique light incidence.

7. The imaging element according to claim 6, wherein the near-infrared absorption filter includes at least two different coloring substances differing in near-infrared light absorption characteristics.

8. The imaging element according to claim 7,
wherein the near-infrared absorption filter includes a first near-infrared absorption layer and a second near-infrared absorption layer, and
the first near-infrared absorption layer includes one of the two different coloring substances, and the second near-infrared absorption layer includes the remaining one of the two different coloring substances.

9. The imaging element according to claim 7, wherein the near-infrared absorption filter includes a single layer.

10. The imaging element according to claim 1, wherein the near-infrared absorption filter is selectively disposed in correspondence with the red light photoelectric conversion section, the green light photoelectric conversion section, and the blue light photoelectric conversion section.

11. The imaging element according to claim 1, wherein the near-infrared absorption filter is selectively disposed for the blue light photoelectric conversion section in the visible light photoelectric conversion section.

12. The imaging element according to claim 1, wherein a color filter and the near-infrared absorption filter are stacked over the light incident surface of the visible light photoelectric conversion section.

13. The imaging element according to claim 1, further comprising:
a near-infrared absorption layer that is disposed integrally with or separately from the dual-pass filter,
wherein the near-infrared light transmission band of the dual-pass filter is sandwiched between a first absorption band and a second absorption band, the first absorption band and the second absorption band being provided for near-infrared light in the near-infrared absorption layer.

14. The imaging element according to claim 13, wherein the near-infrared absorption layer includes at least two different coloring substances differing in near-infrared light absorption characteristics.

15. The imaging element according to claim 14,
wherein the near-infrared absorption layer includes a first near-infrared absorption layer and a second near-infrared absorption layer, and
the first near-infrared absorption layer includes one of two different coloring substances, and the second near-infrared absorption layer includes the remaining one of the two different coloring substances.

16. The imaging element according to claim 14, wherein the near-infrared absorption layer includes a single layer containing two different coloring substances differing in near-infrared light absorption characteristics.

17. A camera system comprising:
an optical section that forms an image of a subject;
an imaging element that includes a plurality of photoelectric conversion sections, the photoelectric conversion sections being arrayed on a substrate to receive light incident through a dual-pass filter having transmission bands for visible light and a predetermined range of near-infrared light; and
a signal processing section that processes signals from the photoelectric conversion sections,
wherein the photoelectric conversion sections include a visible light photoelectric conversion section and a near-infrared light photoelectric conversion section,
wherein the signal processing section performs computation after changing a matrix coefficient in accordance with a position of a photoelectric conversion section, the matrix coefficient being used to perform computation for eliminating an influence of near-infrared light included in a signal from the visible light photoelectric conversion section,
wherein a near-infrared absorption filter is selectively disposed on a light incident surface of the photoelectric conversion sections in correspondence with the visible light photoelectric conversion section, and
wherein at least a part of the near-infrared absorption filter is embedded into an opening in a light-shielding layer separating neighboring photoelectric conversion sections.

18. An imaging element comprising a plurality of photoelectric conversion sections including:
a red light photoelectric conversion section that receives red light incident through a dual-pass filter, a first color filter, and a near-infrared absorption filter;
a green light photoelectric conversion section that receives green light incident through the dual-pass filter, a second color filter, and the near-infrared absorption filter;
a blue light photoelectric conversion section that receives blue light incident through the dual-pass filter, a third color filter, and the near-infrared absorption filter; and
a near-infrared light photoelectric conversion section that receives light incident through the dual-pass filter and a fourth color filter,
wherein at least a part of the near-infrared absorption filter is embedded into an opening in a light-shielding layer formed on a plurality of photoelectric conversion sections.

* * * * *